(12) United States Patent
Shiota et al.

(10) Patent No.: US 11,643,595 B2
(45) Date of Patent: May 9, 2023

(54) WAVELENGTH CONVERSION MEMBER, LIGHT-EMITTING DEVICE, AND IMAGE DISPLAY DEVICE

(71) Applicant: NICHIA CORPORATION, Anan (JP)

(72) Inventors: Yuki Shiota, Tokushima (JP); Keisho Yamashita, Anan (JP); Shoji Hosokawa, Tokushima (JP); Tomokazu Yoshida, Anan (JP); Yohei Yamauchi, Tokushima (JP); Naoto Kijima, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/807,851

(22) Filed: Jun. 20, 2022

(65) Prior Publication Data

US 2022/0403231 A1 Dec. 22, 2022

(30) Foreign Application Priority Data

Jun. 21, 2021 (JP) .............................. JP2021-102683

(51) Int. Cl.
*H01L 51/00* (2006.01)
*F21V 9/30* (2018.01)
(Continued)

(52) U.S. Cl.
CPC .............. *C09K 11/025* (2013.01); *B32B 3/12* (2013.01); *B32B 27/08* (2013.01); *B32B 27/308* (2013.01);
(Continued)

(58) Field of Classification Search
CPC ..... F21V 9/30; F21V 9/38; F21V 3/12; F21V 9/32; H01L 33/502
See application file for complete search history.

(56) References Cited

U.S. PATENT DOCUMENTS 7,235,190 B1 * 6/2007 Wilcoxon .............. C09K 11/02
977/773
9,658,489 B1 * 5/2017 Lee .................... G02F 1/133603
(Continued)

FOREIGN PATENT DOCUMENTS

CN         107541206 A    1/2018
JP      2002347107 A    12/2002
(Continued)

OTHER PUBLICATIONS

Loredana Protesescu et al., University of Electro-Communication. "Nanocrystals of Cesium Lead Halide Perovskites (CsPbX3, X = Cl, Br, and I): Novel Optoelectronic Materials Showing Bright Emission with Wide Color Gamut," Jan. 29, 2015, 14 pages.

*Primary Examiner* — William J Carter
(74) *Attorney, Agent, or Firm* — Hunton Andrews Kurth LLP

(57) ABSTRACT

A wavelength conversion member including a wavelength conversion layer containing a fluoride phosphor, quantum dots, a surfactant, and a resin. The fluoride phosphor contains fluoride particles having a specific composition and having particle size values within specific ranges. The quantum dots include at least one selected from a first crystalline nanoparticle and a second crystalline nanoparticle. The first crystalline nanoparticle has a specific composition. When irradiated with light having a wavelength of 450 nm, the first crystalline nanoparticle emits light having an emission peak at a wavelength in a range from 510 nm to 535 nm, and a full width at half maximum of the emission peak of the first crystalline nanoparticle is in a range from 10 nm to 30 nm. The second crystalline nanoparticle includes a chalcopyrite-type crystalline structure, and a full width at half maximum of the emission peak of the second crystalline nanoparticle is 45 nm or less.

19 Claims, 4 Drawing Sheets

(51) Int. Cl.
*F21V 8/00* (2006.01)
*F21Y 115/10* (2016.01)
*C09K 11/02* (2006.01)
*C09K 11/06* (2006.01)
*B32B 27/36* (2006.01)
*B32B 27/30* (2006.01)
*B32B 27/08* (2006.01)
*B32B 3/12* (2006.01)
*C09K 11/61* (2006.01)

(52) U.S. Cl.
CPC ............ *B32B 27/36* (2013.01); *B32B 27/365* (2013.01); *C09K 11/06* (2013.01); *C09K 11/617* (2013.01); *F21V 9/30* (2018.02); *G02B 6/0073* (2013.01); *H01L 51/0077* (2013.01); *B32B 2255/10* (2013.01); *B32B 2255/20* (2013.01); *B32B 2307/414* (2013.01); *B32B 2307/42* (2013.01); *B32B 2307/7246* (2013.01); *B32B 2307/732* (2013.01); *B32B 2457/20* (2013.01); *C09K 2211/10* (2013.01); *C09K 2211/188* (2013.01); *F21Y 2115/10* (2016.08)

(56) References Cited

U.S. PATENT DOCUMENTS

| | | | |
|---|---|---|---|
| 10,563,122 | B2 | 2/2020 | Kuwabata et al. |
| 2006/0040103 | A1* | 2/2006 | Whiteford ................. C09C 3/12 428/403 |
| 2008/0118755 | A1* | 5/2008 | Whiteford ................ B05D 5/12 428/403 |
| 2008/0238294 | A1* | 10/2008 | Xu .......................... B82Y 30/00 257/E31.038 |
| 2009/0020221 | A1 | 1/2009 | Yamazaki et al. |
| 2012/0032219 | A1 | 2/2012 | Ooyabu et al. |
| 2012/0113672 | A1* | 5/2012 | Dubrow ............... G02B 6/0055 |
| 2013/0070443 | A1* | 3/2013 | Pan ....................... H01L 27/322 977/932 |
| 2014/0275598 | A1* | 9/2014 | Freeman ................ C08G 77/26 556/439 |
| 2015/0008463 | A1 | 1/2015 | Yoshida |
| 2015/0184067 | A1 | 7/2015 | Kajikawa et al. |
| 2015/0263245 | A1 | 9/2015 | Akagawa et al. |
| 2016/0087164 | A1 | 3/2016 | Kawano et al. |
| 2016/0376498 | A1* | 12/2016 | Qiu ........................ C09K 11/02 252/301.36 |
| 2017/0066964 | A1 | 3/2017 | Kaneyoshi et al. |
| 2017/0073392 | A1* | 3/2017 | Arntz .................... A61K 47/62 |
| 2017/0107425 | A1 | 4/2017 | Kaneyoshi et al. |
| 2017/0137707 | A1 | 5/2017 | Jin et al. |
| 2017/0153382 | A1 | 6/2017 | Wang et al. |
| 2017/0155020 | A1 | 6/2017 | Lin et al. |
| 2017/0210982 | A1 | 7/2017 | Yoshida |
| 2017/0283695 | A1 | 10/2017 | Yoshida et al. |
| 2018/0120492 | A1* | 5/2018 | Lee ....................... C09K 11/025 |
| 2018/0208840 | A1 | 7/2018 | Luchinger et al. |
| 2018/0240944 | A1 | 8/2018 | Yoshimura et al. |
| 2018/0298278 | A1 | 10/2018 | Zhong et al. |
| 2019/0153313 | A1 | 5/2019 | Luchinger et al. |
| 2020/0392402 | A1 | 12/2020 | Liichinger et al. |
| 2021/0238477 | A1 | 8/2021 | Butendeich et al. |
| 2021/0363422 | A1 | 11/2021 | Nikata et al. |
| 2021/0384385 | A1 | 12/2021 | Nojima et al. |

FOREIGN PATENT DOCUMENTS

| | | |
|---|---|---|
| JP | 2007002241 A | 1/2007 |
| JP | 2010254933 A | 11/2010 |
| JP | 2012038754 A | 2/2012 |
| JP | 2015028148 A | 2/2015 |
| JP | 2015044951 A | 3/2015 |
| JP | 2015143318 A | 8/2015 |
| JP | 2015163733 A | 9/2015 |
| JP | 2015188075 A | 10/2015 |
| JP | 2016066664 A | 4/2016 |
| JP | 2017108129 A | 6/2017 |
| JP | 2017142486 A | 8/2017 |
| JP | 2017186524 A | 10/2017 |
| JP | 2018012825 A | 1/2018 |
| JP | 2018137321 A | 8/2018 |
| JP | 2018522959 A | 8/2018 |
| JP | 2018530633 A | 10/2018 |
| JP | 6464215 B2 | 2/2019 |
| JP | 2019024122 A | 2/2019 |
| JP | 2019085575 A | 6/2019 |
| JP | 2019526658 A | 9/2019 |
| JP | 2020029559 A | 2/2020 |
| JP | 2020075971 A | 5/2020 |
| JP | 2021006900 A | 1/2021 |
| JP | 2021502446 A | 1/2021 |
| WO | 2021039290 A1 | 3/2021 |

* cited by examiner

WAVELENGTH CONVERSION MEMBER, LIGHT-EMITTING DEVICE, AND IMAGE DISPLAY DEVICE

CROSS-REFERENCE TO RELATED PATENT APPLICATION

The present application claims priority under 35 U. S. C. § 119 to Japanese Patent Application No. 2021-102683, filed Jun. 21, 2021. The contents of Japanese Patent Application No 2021-102683 are incorporated herein by reference in their entirety.

BACKGROUND

Technical Field

The present disclosure relates to a wavelength conversion member, a light-emitting device, and an image display device.

Description of Related Art

Light-emitting devices in which a light-emitting element and a wavelength conversion member are combined are used in a wide range of fields such as in illumination, on-board lighting, displays, and liquid crystal backlights. For example, a luminescent material contained in a wavelength conversion member used in a light-emitting device of a backlight application in a liquid crystal display device is required to have high color purity, that is, the full width at half maximum of the emission peak must be narrow. For example, Patent Document 1 discloses, as a red luminous phosphor having a narrow full width at half maximum of the emission peak, a fluoride phosphor having a specific composition (for example, Japanese Unexamined Patent Publication No. 2010-254933).

Furthermore, as a green luminescent material having a narrow full width at half maximum of the emission peak, a perovskite-type nanoparticle (also referred to as a quantum dot) that expresses a quantum size effect is known. The quantum size effect refers to a phenomenon in which each of a conduction band and a valence band considered to be continuous in bulk particles becomes discrete when the particle size is reduced to a nano size, and the band gap energy changes in accordance with the particle size. For example, Patent Document 2 proposes a composite luminescent material including a matrix, perovskite-type nanoparticles, and a specific additive (for example, Japanese Unexamined Patent Publication No. 2018-522959).

SUMMARY

According to an exemplary aspect of the present disclosure, provided is a wavelength conversion member comprising a wavelength conversion layer containing a fluoride phosphor, quantum dots, a surfactant, and a resin. The fluoride phosphor contains fluoride particles having a composition containing: an element M including at least one selected from the group consisting of Group 4 elements, Group 13 elements, and Group 14 elements; an alkali metal; Mn; and F; wherein in the composition, when a number of moles of the alkali metal is 2, a number of moles of Mn is in a range from greater than 0 to less than 0.2, a number of moles of the element M is in a range from greater than 0.8 to less than 1, and a number of moles of F is in a range from greater than 5 to less than 7. Further, the fluoride particles have an average particle size in a range from 0.1 µm to less than 10 µm and a maximum particle size in a range from 1 µm to 18 µm, and a ratio of the maximum particle size to the average particle size is greater than 1. The quantum dots include at least one selected from the group consisting of a first crystalline nanoparticle and a second crystalline nanoparticle. The first crystalline nanoparticle has a composition containing: a cation J including at least one selected from the group consisting of alkali metal ions, ammonium, methylammonium, formamidinium, guanidium, imidazolium, pyridinium, pyrrolidium, and protonated thiourea; a metal L including at least one selected from the group consisting of germanium, tin, lead, antimony, and bismuth; and an anion X including at least one selected from the group consisting of halogen ions, cyanide ions, thiocyanate ions, isothiocyanate ions, and sulfide ions, wherein in the composition, when a number of moles of the cation J is 1, a number of moles of the metal L is in a range from 0.9 to 1.1, and a number of moles of the anion X is in a range from 2.7 to 3.3. Further, the first crystalline nanoparticle has a median diameter in a range from 3 nm to 15 nm and emits light having an emission peak at a wavelength in a range from 510 nm to 535 nm when irradiated with light having a wavelength of 450 nm, and a full width at half maximum of the emission peak of the first crystalline nanoparticle is in a range from 10 nm to 30 nm. The second crystalline nanoparticle includes a chalcopyrite-type crystalline structure, and a full width at half maximum of the emission peak of the second crystalline nanoparticle is 45 nm or less.

According to a second exemplary aspect of the present disclosure, provided is a light-emitting device comprising the wavelength conversion member of the first exemplary aspect and a light-emitting element.

According to further aspect of the present disclosure, provided is a display device comprising the light-emitting device of the second exemplary aspect, wherein an area of a color reproduction range on a CIE chromaticity diagram is greater than or equal to 85% of an area of a color reproduction range defined by the BT2020 standard.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENTS

Figure 1:
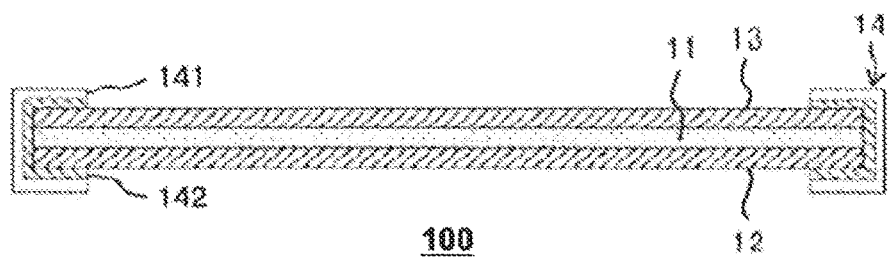
FIG. 1 is schematic cross-sectional view illustrating an exemplary wavelength conversion member.

The word "step" herein is included in the present terminology if the anticipated purpose of the step is achieved in the case of not only an independent step, but also a step that cannot be clearly distinguished from another step. If a plurality of substances applicable to each component in a composition are present, the content of each component in the composition means the total amount of the plurality of substances present in the composition, unless otherwise specified. Furthermore, the numeric values of upper and lower limits of numerical ranges described herein can be optionally selected and combined. Note that herein, relationships such as the relationship between a color name and a chromaticity coordinate, the relationship between a wavelength range of light and a color name of monochromatic light are in accordance with JIS Z8110. The full width at half maximum of a phosphor and a light-emitting element means a wavelength width (full width at half maximum: FWHM) of an emission peak at which the light emission intensity becomes 50% of the maximum light emission intensity in the emission spectrum of the phosphor and light-emitting element. Embodiments of the present invention will be described below in detail. The embodiments presented below exemplify wavelength conversion members, light-emitting devices, and display devices that embody the technical concept of the present invention, but the present invention is not limited to the wavelength conversion members, light-emitting devices, and display devices presented below.

Wavelength Conversion Member

The wavelength conversion member is provided with a wavelength conversion layer that contains a fluoride phosphor, quantum dots, a surfactant, and a resin. The fluoride phosphor contains fluoride particles having a composition containing: an element M including at least one selected from the group consisting of Group 4 elements, Group 13 elements, and Group 14 elements; an alkali metal; Mn; and F; the composition being such that if the number of moles of the alkali metal is 2, the number of moles of Mn is in a range from greater than 0 to less than 0.2, the number of moles of the element M is in a range from greater than 0.8 to less than 1, and the number of moles of F is in a range from greater than 5 to less than 7. Further, the fluoride particles have an average particle size in a range from 0.1 µm to less than 10 µm and a maximum particle size in a range from 1 µm to 18 µm, and a ratio of the maximum particle size to the average particle size is greater than 1. The quantum dots include at least one selected from the group consisting of a first crystalline nanoparticle and a second crystalline nanoparticle. The first crystalline nanoparticle has a composition containing: a cation J including at least one selected from the group consisting of alkali metal ions, ammonium, methyl-ammonium, formamidinium, guanidium, imidazolium, pyridinium, pyrrolidium, and protonated thiourea; a metal L including at least one selected from the group consisting of germanium, tin, lead, antimony, and bismuth; and an anion X including at least one selected from the group consisting of halogen ions, cyanide ions, thiocyanate ions, isothiocyanate ions, and sulfide ions, the composition being such that if the number of moles of the cation J is 1, the number of moles of the metal L is in a range from 0.9 to 1.1, and the number of moles of the anion X is in a range from 2.7 to 3.3. Further, the first crystalline nanoparticle has a median diameter in a range from 3 nm to 15 nm and emits light having an emission peak at a wavelength in a range from 510 nm to 535 nm when irradiated with light having a wavelength of 450 nm, and a full width at half maximum of the emission peak is in a range from 10 nm to 30 nm. The second crystalline nanoparticle includes a chalcopyrite-type crystalline structure, and a full width at half maximum of the emission peak of the second crystalline nanoparticle is 45 nm or less.

When the average particle size of the fluoride phosphor contained in the wavelength conversion layer is in a range from 0.1 µm to less than 10 µm, the maximum particle size is in a range from 1 µm and to 18 µm, and the ratio of the maximum particle size to the average particle size is greater than 1, non-uniformity of the luminescent color of the light-emitting surface of the sheet-shaped wavelength conversion member is suppressed, and the luminescent color becomes uniform. The reason for this is thought to be, for example, a suppression in deviation in the distribution amount of the fluoride phosphor in the wavelength conversion layer.

The fluoride particles contained in the fluoride phosphor may contain a fluorescent substance that is activated by at least Mn, and may consist of only a fluorescent substance that is activated by Mn. The fluorescent substance activated by Mn may be, for example, a substance in which the main crystalline phase has the same crystal structure as that of $K_2SiF_6$ crystals, and this crystal structure can be confirmed by powder X-ray diffraction. When the main crystalline phase of the fluoride particles is set to the same crystal structure as that of $K_2SiF_6$ crystals, a desired emission peak wavelength is obtained, and favorable luminance can be achieved. The fluoride particles may be a single phase in which mixing in of crystalline phases other than the main crystalline phase is suppressed, or may contain a crystalline phase other than the main crystalline phase as long as there is no significant effect on the characteristics of the fluoride phosphor.

The average particle size of the fluoride particles constituting the fluoride phosphor may be in a range from 0.1 m to less than 10 µm, and preferably 0.2 µm or greater, or 0.5 µm or greater. Furthermore, the average particle size is preferably 7 µm or less, 6 µm or less, 5 µm or less, or 3 µm or less. Here, the average particle size of the fluoride particles is the Fisher Sub Sieve Sizer's No. (F.S.S.S. No.) obtained by the Fisher Sun Sieve Sizer method (FSSS method), which is an air permeation method. The average particle size according to the FSSS method is measured using, for example, the Fisher Sub-Sieve Sizer Model 95 available from Fisher Scientific. Note that the average particle size measured by this method has been confirmed by the inventors to exhibit good correlation with the average particle size determined from a scanning electron microscope (SEM) image. Here, the average particle size determined from an SEM image is calculated by obtaining a plurality of SEM images in which approximately 100 fluoride particles are observed in one image at a magnification in a range from 250 times to 5000 times at an acceleration voltage of 5 kV, then measuring the minimum length and maximum length of each particle and averaging the two lengths, and then using the average as the particle size and determining the arithmetic mean of the particle size for a quantity of 1000 particles.

If the average particle size of the fluoride particles is less than 10 µm, deviation in the distribution amount of the fluoride phosphor in the sheet-shaped wavelength conversion member can be suppressed, fluctuations in excitation efficiency due to deviation in the distribution amount are suppressed, and fluctuations in chromaticity of the luminescent color are suppressed. Furthermore, the amount of fluoride phosphor that is required to achieve the desired luminescent characteristics in the wavelength conversion member can be reduced. When the average particle size is 0.1 µm or greater, dispersibility of the fluoride phosphor in the resin constituting the sheet-shaped wavelength conversion member is improved, and the fluoride phosphor can be more uniformly distributed. Accordingly, a sheet-shaped wavelength conversion member having higher uniformity can be easily configured, and the luminous flux of the light-emitting device tends to be further improved.

The maximum particle size of the fluoride particles may be in a range from 1 µm to 18 µm, and is preferably 15 µm or less, 10 µm or less, or 6 µm or less. The maximum particle size of the fluoride particles is measured in an SEM image as follows. An SEM image is obtained in which approximately 500 or more particles of the fluoride phosphor are observed at a magnification of 250 times and an acceleration voltage of 5 kV. Subsequently, SEM images are obtained for each of a plurality of particles estimated to have a maximum particle size from amongst the 500 or more particles, and in each of the SEM images, the particle is enlarged. The magnification at that time is approximately 5000 times. The particle length of each of the plurality of particles is measured from the pre-calibrated scale of the SEM images. The particle lengths of the measured particles are compared, and the particle length of the particle having the maximum particle length is used as the maximum particle size of the fluoride particle. Note that with respect to a particle observed to be present independent from other particles, the particle length of the particle is a line segment connecting any two points on the outer perimeter of the particle, and of line segments passing through the interior of the particle, the length of the longest line segment is considered to be the particle length of the particle. Here, a "particle observed to be present independent from other particles" is a particle that is determined to be not adhered to other particles. In addition, for a case in which the particle is a secondary particle formed by aggregating a plurality of primary particles, the particle length of the secondary particle is measured.

Figure 5:
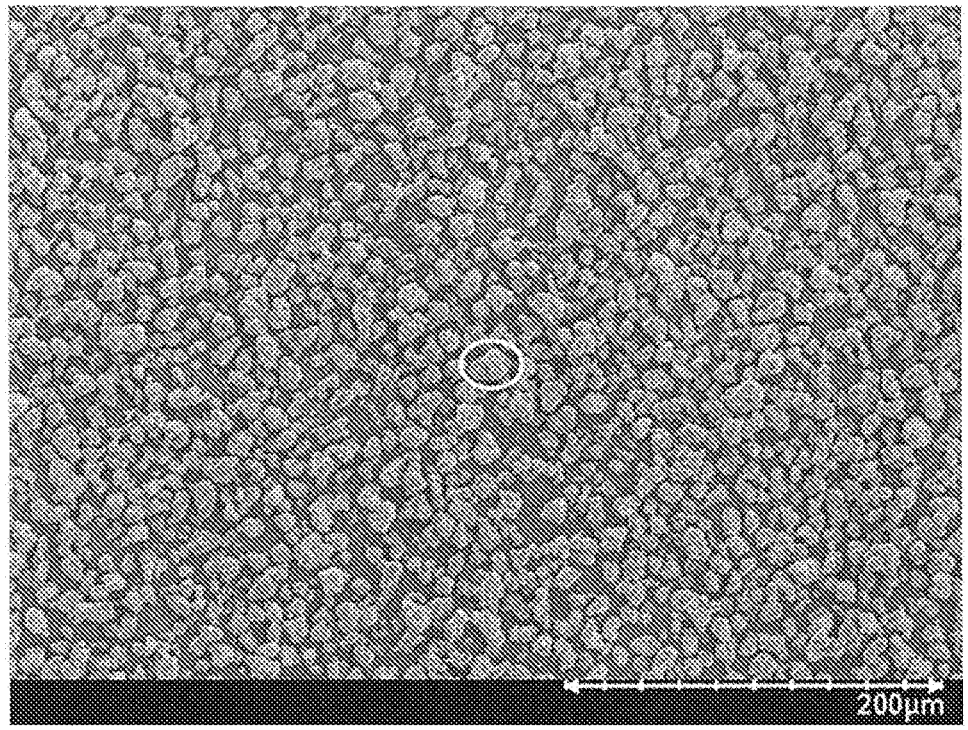
FIG. 5 is a scanning electron microscope (SEM) image for explaining an exemplary method for measuring the maximum length of a fluoride particle.
Figure 6:
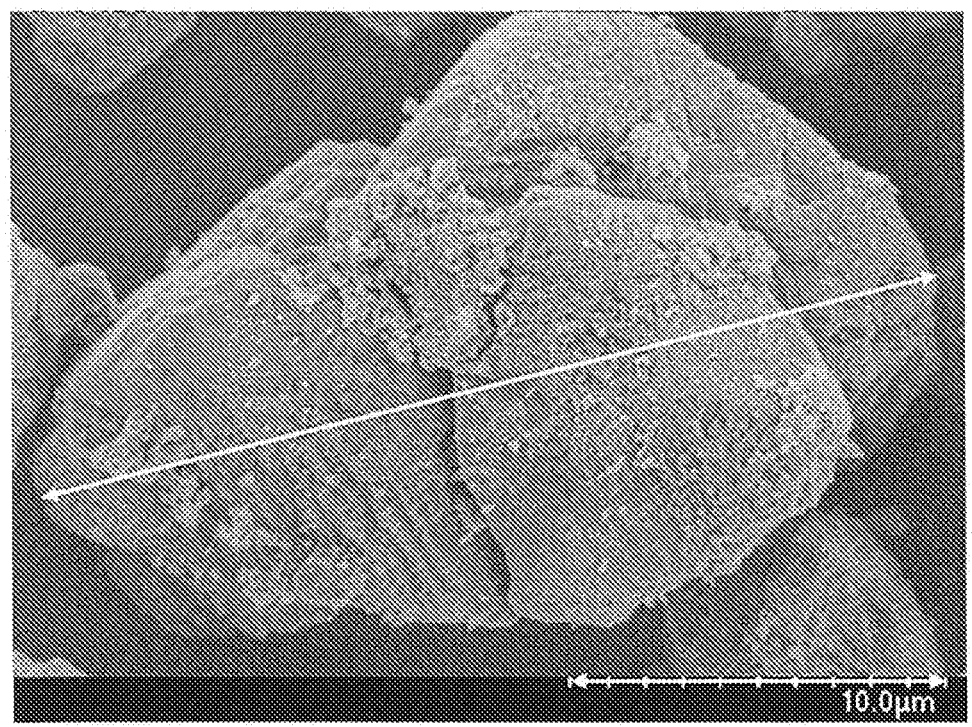
FIG. 6 is an enlarged SEM image for explaining the exemplary method for measuring the maximum length of the fluoride particle.

How to determine the maximum length of a particle is described with reference to the drawings. FIG. 5 is an example of an SEM image of fluoride particles magnified 250 times. From the field of view of the SEM image of FIG. 5, the particle indicated by the white circle is selected as the particle estimated to have a maximum length. An SEM image magnified 5000 times is illustrated in FIG. 6 as a further enlarged image of the selected particle. As illustrated in FIG. 6, the selected particle is a secondary particle configured from a plurality of primary particles. As illustrated in FIG. 6, the maximum length of the fluoride particle is measured as a line segment of a maximum length connecting two points on the outer perimeter of this secondary particle.

When the maximum particle size of the fluoride particles is 18 µm or less, the dispersibility of the fluoride phosphor with respect to the resin constituting the sheet-shaped wavelength conversion member tends to improve. In addition, the mixed state with other fluorescent materials in the wavelength conversion member becomes more uniform, and there is a tendency for fluctuations in chromaticity in the surface direction of the sheet-shaped wavelength conversion member and the occurrence of color unevenness in the irradiation surface of the light-emitting device to be suppressed.

The maximum particle size of the fluoride particles need only be greater than the average particle size. In other words, the ratio of the maximum particle size to the average particle size is greater than 1, and is preferably 2 or greater, or 5 or greater. Also for example, the ratio of the maximum particle size to the average particle size may be 10 or less, and is preferably 8 or less, 7 or less, or 6 or less.

From the perspective of improving luminance, the particle size distribution of the fluoride phosphor may be a particle size distribution of a single peak. The particle size distribution of the fluoride phosphor may preferably be a particle size distribution of a single peak having a narrow distribution width. Specifically, in a particle size distribution on a volume basis, when a particle size corresponding to a cumulative volume of 10% from the small diameter side is denoted by D10 and a particle size corresponding to a cumulative volume of 90% is denoted by D90, a ratio (D90/D10) of D90 to D10 may be 10 or less.

The fluoride particles may contain an element M including at least one selected from the group consisting of Group 4 elements, Group 13 elements, and Group 14 elements, and also an alkali metal, Mn, and F. The composition of the fluoride particles is such that when the number of moles of the alkali metal is 2, the number of moles of Mn may be in a range of greater than 0 to less than 0.2, and is preferably in a range from 0.01 to 0.12. The composition of the fluoride particles is also such that when the number of moles of the alkali metal is 2, the number of moles of the element M may be in a range from greater than 0.8 to less than 1, and is preferably in a range from 0.88 to 0.99. The composition of the fluoride particles is also such that when the number of moles of the alkali metal is 2, the number of moles of F may be in a range from greater than 5 to less than 7, and is preferably in a range from 5.9 to 6.1. The composition of the fluoride particles can be measured, for example, by inductively coupled plasma (ICP) emission spectroscopy.

The element M in the composition of the fluoride particles includes at least one selected from the group consisting of Group 4 elements, Group 13 elements, and Group 14 elements. Examples of Group 4 elements include titanium (Ti), zirconium (Zr), and hafnium (Hf), and at least one selected from the group consisting of these elements may be included. Examples of Group 13 elements include boron (B), aluminum (Al), gallium (Ga), indium (In), and thallium (Tl), and at least one selected from the group consisting of these elements may be included. Examples of Group 14 elements include carbon (C), silicon (Si), germanium (Ge), and tin (Sn), and at least one selected from the group consisting of these elements may be included. The element M may include at least one of at least the Group 14 elements, may preferably include at least one of at least Si and Ge, and may more preferably include at least Si. In addition, the element M may include at least one of the Group 13 elements and at least one of the Group 14 elements, and preferably at least one of Al, Si, and Ge, and more preferably at least Al and Si.

The alkali metal in the composition of the fluoride particles may include at least one selected from the group consisting of lithium (Li), sodium (Na), potassium (K), rubidium (Rb), and cesium (Cs). The alkali metal may include at least potassium (K), and at least one selected from the group consisting of lithium (Li), sodium (Na), rubidium (Rb), and cesium (Cs). A ratio of the number of moles of potassium (K) to the total number of moles of the alkali metal in the composition may be, for example, 0.90 or greater, and preferably 0.95 or greater, or 0.97 or greater. The upper limit of the ratio of the number of moles of K may be, for example, not greater than 1 or 0.995. In the composition of the fluoride particles, some of the alkali metals may be substituted with ammonium ions ($NH_4^+$). When some of the alkali metals are substituted with ammonium ions, the ratio of the number of moles of the ammonium ions to the total number of moles of the alkali metal in the composition may be, for example, 0.10 or less, and preferably 0.05 or less, or 0.03 or less. The lower limit of the ratio of the number of moles of ammonium ions may be, for example, greater than 0, and may be preferably 0.005 or greater.

A first composition, which is one aspect of the composition of the fluoride particles, may contain, as the element M, at least one selected from the group consisting of Group 4 elements and Group 14 elements, preferably at least one selected from the group consisting of Group 14 elements, and more preferably Si and/or Ge, and even more preferably at least Si. In addition, the first composition of the fluoride particle may have a total number of moles of Si, Ge, and Mn in a range from 0.9 to 1.1, preferably from 0.95 to 1.05, or from 0.97 to 1.03, per 2 moles of the alkali metal.

The first composition of the fluoride particles may be a composition represented by Formula (1) below.

$$A^1_a[M^1_{1-b}Mn_bF_d] \qquad (1)$$

In Formula (1), $A^1$ may include at least one selected from the group consisting of Li, Na, K, Rb, and Cs. $M^1$ includes least Si and/or Ge, and may further include at least one element selected from the group consisting of Group 4 elements and Group 14 elements. Mn may be a tetravalent Mn ion. Furthermore, b satisfies 0<b<0.2, c is the absolute value of the charge of the $[M^1_{1-b}Mn_bF_d]$ ion, and d satisfies 5<d<7.

$A^1$ in Formula (1) includes at least K, and may further include at least one selected from the group consisting of Li, Na, Rb, and Cs. Also, some of the $A^1$ may be substituted with ammonium ions ($NH_4^+$). When some of the $A^1$ are substituted with ammonium ions, the ratio of the number of moles of the ammonium ions to the total number of moles of $A^1$ in the composition may be, for example, 0.10 or less, and preferably 0.05 or less or 0.03 or less. The lower limit of the ratio of the number of moles of ammonium ions may be, for example, greater than 0, and may be preferably 0.005 or greater.

In Formula (1), b is preferably in a range from 0.005 to 0.15, from 0.01 to 0.12, or from 0.015 to 0.1. Also, c may be, for example, in a range from 1.8 to 2.2, preferably from 1.9 to 2.1, or from 1.95 to 2.05. Furthermore, d is preferably in a range from 5.5 to 6.5, from 5.9 to 6.1, from 5.92 to 6.05, or from 5.95 to 6.025.

A second composition, which is one aspect of the composition of the fluoride particles, may contain, as the element M, at least one selected from the group consisting of Group 4 elements and Group 14 elements and at least one Group 13 element, and preferably at least one selected from the group consisting of Group 14 elements and at least one Group 13 element, and more preferably at least Si and Al. In addition, the second composition of the fluoride particle may have a total number of moles of Si, Al, and Mn in a range from 0.9 to 1.1, preferably from 0.95 to 1.05, or from 0.97 to 1.03, per 2 moles of the alkali metal. Furthermore, the second composition of the fluoride particles may have a number of moles of Al in a range from greater than 0 to 0.1, and preferably greater than 0 to 0.03, from 0.002 to 0.02, or from 0.003 to 0.015, per 2 moles of the alkali metal.

The second composition of the fluoride particles may be a composition represented by Formula (2) below.

$$A^2_f[M^2_{1-e}Mn_eF_g] \qquad (2)$$

In Formula (2), $A^2$ may include at least one selected from the group consisting of Li, Na, K, Rb, and Cs. $M^2$ includes at least Si and Al, and may further include at least one element selected from the group consisting of Group 4 elements, Group 13 elements, and Group 14 elements. Mn may be a tetravalent Mn ion. Furthermore, e satisfies 0<e<0.2, f is the absolute value of the charge of the $[M^2_{1-e}Mn_eF_g]$ ion, and g satisfies 5<g<7.

$A^2$ in Formula (2) includes at least K, and may further include at least one selected from the group consisting of Li, Na, Rb, and Cs. Also, some of the $A^2$ may be substituted with ammonium ions ($NH_4^+$). When some of the $A^2$ are substituted with ammonium ions, the ratio of the number of moles of the ammonium ions to the total number of moles of $A^2$ in the composition may be, for example, 0.10 or less, and preferably 0.05 or less or 0.03 or less. The lower limit of the ratio of the number of moles of ammonium ions may be, for example, greater than 0, and may be preferably 0.005 or greater.

In Formula (2), e is preferably in a range from 0.005 to 0.15, from 0.01 to 0.12, or from 0.015 to 0.1. Also, f may be, for example, in a range from 1.8 to 2.2, preferably from 1.9 to 2.1, or from 1.95 to 2.05. Furthermore, g is preferably in a range from 5.5 to 6.5, in a range from 5.9 to 6.1, from 5.92 to 6.05, or from 5.95 to 6.025.

An inorganic substance other than the fluoride particles may be adhered to at least a portion of the surface of the fluoride particles constituting the fluoride phosphor. Adhering an inorganic substance to the surface of the fluoride particles tends to improve the dispersibility of the fluoride phosphor in the resin, for example. Furthermore, moisture resistance of the fluoride phosphor tends to be improved. Examples of inorganic substances other than the fluoride particles include oxides, metal salts, fluorides, and nitrides. At least one selected from the group consisting of these may be included, and preferably at least one selected from the group consisting of oxides and metal salts is included. The inorganic substance adhering to the fluoride particles may be a single type, or a combination of two or more types may be used. When two or more types of inorganic substances are combined and used, a mixture of the inorganic substances may be adhered to the fluoride particles, or the inorganic substances may be adhered sequentially and adhered in a multilayer configuration.

The oxide may include at least one selected from the group consisting of Si, Al, Ti, Zr, Sn, and Zn. That is, the oxide may include at least one selected from the group consisting of silicon oxides (for example, $SiO_x$, where x may be in a range from 1 to 2, preferably from 1.5 to 2, or approximately 2), aluminum oxides (for example, $Al_2O_3$), titanium oxides (for example, $TiO_2$), zirconium oxides (for example, $ZrO_2$), tin oxides (for example, SnO and $SnO_2$), and zinc oxides (for example, ZnO), and may include at least a silicon oxide. A single type of oxide may be included, or two or more types may be included.

The content of the oxide in the fluoride phosphor may be in a range from 0.02 mass % to 30 mass %, and preferably from 1 mass % to 15 mass %, relative to the fluoride phosphor. The content of the oxide in the fluoride phosphor can be measured, for example, through inductively coupled plasma (ICP) emission spectroscopy.

The metal salt may include, for example, a rare earth phosphate or an alkaline earth metal phosphate, and at least one selected from the group consisting of these may be included. The rare earth phosphate may include at least one rare earth element selected from the group consisting of lanthanum (La), cerium (Ce), dysprosium (Dy) and gadolinium (Gd), and preferably at least lanthanum.

The content of the metal salt in the fluoride phosphor may be, for example, in a range from 0.1 mass % to 20 mass %, and preferably from 0.1 mass % to 15 mass %, or from 0.2 mass % to 10 mass %, in terms of the content of the metal element.

Examples of the fluoride other than the fluoride particles include fluorides containing a Group 2 element such as magnesium fluoride and calcium fluoride, and fluorosilicates such as an alkali metal hexafluorosilicate.

The content of fluoride other than the fluoride particles in the fluoride phosphor may be, for example, in a range from 0.1 mass % to 15 mass %, preferably from 0.2 mass % to 15 mass %, or from 0.3 mass % to 10 mass %.

The inorganic substance adhering to the surface of the fluoride particle may be attached as inorganic substance particles to cover the surface of the fluoride particles. In addition, the inorganic substance may cover the surface of the fluoride particles in a film shape, or may be disposed as an inorganic substance film on at least a portion of the surface of the fluoride particles. Furthermore, the inorganic substance film covering the surface of the fluoride particle is not limited to a state in which no cracks are present, and cracks may be present in a portion of the inorganic substance film covering the surface of the fluoride particle. In addition, although the inorganic substance film covering the surface of the fluoride particle preferably completely covers the entire surface thereof, a portion of the inorganic substance film may be partially missing, and a portion of the surface of the fluoride particle may be exposed. The percentage of the fluoride particle covered by the inorganic substance in the fluoride phosphor may be, for example, 50% or greater, preferably 80% or greater, or 90% or greater. The percentage of the fluoride particle covered by the inorganic substance is calculated as the ratio of the area of the region covered by the inorganic substance to the surface area of the fluoride particle.

The fluoride phosphor is, for example, a phosphor activated by a tetravalent manganese ion, and the fluoride phosphor absorbs light of a short wavelength range of visible light and emits red light. The excitation light may be primarily light in the blue range, and the peak wavelength of the excitation light may be within a wavelength range of, for example, from 380 nm to 485 nm. The emission peak wavelength in the emission spectrum of the fluoride phosphor may be, for example, within a wavelength range from 610 nm to 650 nm. The full width at half maximum in the emission spectrum of the fluoride phosphor may be, for example, 10 nm or less.

The fluoride phosphor contained in the wavelength conversion layer may be a single type, or may be a combination of two or more types. The content of the fluoride phosphor in the wavelength conversion layer may be adjusted, as appropriate, according to the chromaticity of the light emitted by the wavelength conversion member. Specifically, for example, the content of the fluoride phosphor may be in a range from 25 parts by mass to 110 parts by mass, and preferably from 35 parts by mass to 100 parts by mass, relative to 100 parts by mass of the resin.

Fluoride Phosphor Manufacturing Method

The fluoride particles constituting the fluoride phosphor can be manufactured, for example, as follows. In a case in which the fluoride particles have a first composition, for example, the fluoride particles can be manufactured by a manufacturing method including a step of mixing a solution a and a solution b, the solution a containing at least hydrogen fluoride, a first complex ion including tetravalent manganese, and a second complex ion including a fluorine ion and at least one selected from the group consisting of Group 4 elements and Group 14 elements, and the solution b containing at least hydrogen fluoride and an alkali metal including at least potassium.

The fluoride particle can also be manufactured by a manufacturing method including a step of mixing a first solution, a second solution, and a third solution, wherein the first solution contains at least hydrogen fluoride and a first complex ion including tetravalent manganese, the second solution contains at least hydrogen fluoride and an alkali metal including at least potassium, and the third solution contains at least a second complex ion including a fluorine ion and at least one selected from the group consisting of Group 4 elements and Group 14 elements. JP 2015-143318 A, JP 2015-188075 A, and the like can be referenced, for example, for details on the method for manufacturing the fluoride particles having the first composition.

In a case in which the fluoride particles have a second composition, the fluoride particles can be manufactured by the manufacturing method described in JP 2010-254933 A, for example. Alternatively, for example, the disclosure of the specification of JP 2020-212532 can be referenced for details of a method for manufacturing fluoride particles having the second composition. In other words, the fluoride particles can be manufactured by a manufacturing method including: preparing fluoride particles having the first composition; preparing fluoride particles containing Al, an alkali metal, and F; and heat treating a mixture of the fluoride particles having the first composition and the fluoride particles containing Al, an alkali metal, and F in an inert gas atmosphere at a temperature in a range from 600° C. to 780° C. Here, the composition of the fluoride particles containing Al, an alkali metal, and F may be such that the ratio of the total number of moles of the alkali metal per mole of Al is in a range from 1 to 3, and the ratio of the number of moles of F per mole of Al is in a range from 4 to 6. Alternatively, the ratio of the total number of moles of the alkali metal per mole of Al may be in a range from 2 to 3, and the ratio of the number of moles of F per mole of Al may be in a range from 5 to 6.

In the method for manufacturing a fluoride phosphor, fluoride particles having a desired average particle size and a desired maximum particle size can be precipitated by controlling the concentration, dripping speed, and the like of each fluorine-containing reaction solution in which the constituent elements of the fluoride particles are dissolved.

The method for manufacturing the fluoride phosphor may include an adjustment step in which the particle size of the fluoride particles is adjusted. The adjustment step may include, for example, grinding the fluoride particles to obtain a ground product. The fluoride particles subjected to the adjustment step may have, for example, an average particle size in a range from 5 μm to 30 μm, and preferably from 7 μm to 20 μm. Furthermore, the maximum particle size of the fluoride particles subjected to the adjustment step may be, for example, in a range from 10 μm to 100 μm, and preferably from 15 μm to 60 μm.

The method of grinding the fluoride particles can be appropriately selected from commonly used grinding methods such as a ball mill, a bead mill, or a jet mill. The method for grinding the fluoride particles is preferably implemented in a wet process. By grinding the fluoride particles in a wet process, the particle size distribution can be adjusted to a narrow range while suppressing a decrease in luminance of the fluoride phosphor. The wet grinding treatment can be implemented, for example, by ball milling the fluoride particles together with a grinding media in a liquid medium. Examples of the liquid medium include a water-based liquid medium such as water and hydrogen peroxide, and an organic solvent such as ethanol. The liquid medium may include at least a water-based liquid medium. Examples of the grinding media include alumina balls, zirconia balls, and urethane balls.

The usage amount of the grinding media in the grinding treatment may be an amount such that the usage amount of fluoride particles with respect to the usage amount of the grinding media is, for example, in a range from 1 mass % to 50 mass %, and preferably from 5 mass % to 30 mass %.

In a grinding treatment using a ball mill, for example, grinding is preferably implemented at a low speed for a time in a range from 1 hour to 72 hours with the grinding efficiency suppressed. Grinding slowly with a weak shear force for one hour or longer suppresses grinding of the fluoride particles to a fine powder and suppresses a decrease in luminance of the fluoride phosphor. The productivity is improved by setting the grinding time to 72 hours or less. The grinding time using a ball mill may be preferably set to a range from 2 hours to 24 hours. Furthermore, the temperature in the grinding treatment may be set, for example, to a range from 0° C. to 80° C., and preferably from 5° C. to 50° C.

The method for manufacturing the fluoride phosphor may further include adjusting the particle size distribution of the ground product. By adjusting the particle size distribution of the ground product, fluoride particles having a narrower particle size distribution can be obtained. The particle size distribution of the ground product can be adjusted, for example, by washing with a liquid medium and classifying.

The method of manufacturing a fluoride phosphor may further include a heat treatment step in which the fluoride particles are heat treated at a heat treatment temperature of 400° C. or higher with the fluoride particles in contact with a fluorine-containing substance to thereby obtain a heat treated product. The heat treated product includes the intended fluoride particles.

It is thought that by heat treating the fluoride particles in a state in which the fluoride particles are in contact with the fluorine-containing substance, fluorine atoms are supplied to regions where fluorine atoms are insufficient in the crystal structure of the fluoride phosphor, and defects in the crystal structure are further reduced. It is also thought that the luminance is further improved as a result. It is also thought that the durability of the fluoride phosphor is further improved.

The fluorine-containing substance used in the heat treatment step may be in a solid state, a liquid state, or a gaseous state at room temperature. An example of a fluorine-containing substance that is in a solid or liquid state is $NH_4F$. Also, examples of fluorine-containing substances that are in a gaseous state include $F_2$, $CHF_3$, $CF_4$, $NH_4HF_2$, HF, $SiF_4$, $KrF_4$, $XeF_2$, $XeF_4$, and $NF_3$. The fluorine-containing substance that is in a gaseous state may be at least one selected from the group consisting of these, and is preferably at least one selected from the group consisting of $F_2$ and HF.

When the fluorine-containing substance is in a solid state or a liquid state at room temperature, the fluoride particles and the fluorine-containing substance can be brought into contact by mixing these. For example, the fluoride particles may be mixed with a fluorine-containing substance of an amount in a range from 1 mass % to 20 mass %, and preferably from 2 mass % to 10 mass % in terms of the mass of the fluorine atoms, relative to 100 mass % of the total amount of the fluoride particles and the fluorine-containing substance.

The temperature when mixing the fluoride particles and the fluorine-containing substance may be, for example, a temperature in a range from room temperature (20° C.±5° C.) to lower than the heat treatment temperature, or may be the heat treatment temperature. Specifically, the temperature when mixing may be a temperature in a range from 20° C. to lower than 400° C., or may be a temperature of 400° C. or higher. When the temperature at which the fluoride particles are brought into contact with the fluorine-containing substance that is in a solid state or a liquid state at room temperature is in a range from 20° C. to lower than 400° C., the heat treatment is preferably implemented at a temperature of 400° C. or higher after the fluoride particles and the fluorine-containing substance have been brought into contact.

When the fluorine-containing substance is a gas, the fluoride particles may be disposed in an atmosphere containing the fluorine-containing substance and brought into contact with the atmosphere thereof. The atmosphere containing the fluorine-containing substance may include an inert gas such as noble gas or nitrogen in addition to the fluorine-containing substance. In this case, the concentration of the fluorine-containing substance in the atmosphere may be, for example, in a range from 3 vol. % to 35 vol. %, preferably 5 vol. % or greater or 10 vol. % or greater, and preferably 30 vol. % or less or 25 vol. % or less.

The heat treatment may be implemented by maintaining a predetermined heat treatment temperature over a predetermined period of time while the fluoride particles and the fluorine-containing substance are in a contacting state. The heat treatment temperature may be, for example, 400° C. or higher, preferably a temperature higher than 400° C., 425° C. or higher, 450° C. or higher, or 480° C. or higher. The upper limit of the heat treatment temperature may be, for example, lower than 600° C., preferably 580° C. or lower, 550° C. or lower, or 520° C. or lower.

When the heat treatment temperature is equal to or higher than the lower limit described above, fluorine atoms are sufficiently supplied to the fluoride particles, and the luminance of the obtained fluoride phosphor tends to be further improved. When the heat treatment temperature is lower than or equal to the upper limit described above, decomposition of the obtained fluoride phosphor is more effectively suppressed, and the luminance of the obtained fluoride phosphor tends to be further improved.

The heat treatment time for the heat treatment, that is, the amount of time at which the predetermined heat treatment temperature is maintained, may be, for example, in a range from 1 hour to 40 hours, preferably 2 hours or longer or 3 hours or longer, and preferably 30 hours or less, 10 hours or less, or 8 hours or less. If the heat treatment time at the predetermined heat treatment temperature is within the range described above, fluorine atoms can be sufficiently supplied to the fluoride particles. As a result, the crystal structure of the fluoride particles is more stable, and a fluoride phosphor having high luminance tends to be obtained.

The pressure in the heat treatment step may be the atmospheric pressure (0.101 MPa), may be in a range from greater than the atmospheric pressure to 5 MPa or lower, or may be in a range from greater than the atmospheric pressure to 1 MPa or lower.

The method for manufacturing the fluoride phosphor may include a surface treatment step in which an inorganic substance is adhered to at least a portion of the surface of the fluoride particles. Through the surface treatment step, fluoride phosphors having further improved dispersibility in the resin, moisture resistance, and the like can be obtained. The surface treatment step can be appropriately selected from commonly used methods according to the inorganic substance to be adhered. Note that fluoride particles for which the average particle size and maximum particle size have been adjusted to a desired range are used as the fluoride particles used in the surface treatment step.

In a case in which the inorganic substance that is adhered in the surface treatment step is an oxide, for example, an oxide derived from a metal alkoxide can be adhered to at least a portion of the surface of the fluoride particles by causing the fluoride particles and the metal alkoxide to contact in a liquid medium. The metal alkoxide may be, for example, a metal alkoxide including at least one selected from the group consisting of Si, Al, Ti, Zr, Sn, and Zn, or may be a metal alkoxide including at least one of Si and Al. An aliphatic group of the alkoxide constituting the metal alkoxide may be, for example, an aliphatic group having a number of carbons in a range from 1 to 6, preferably from 1 to 4, or from 1 to 3. For details on the method for adhering the oxide to the fluoride particles, a so-called sol-gel method can be referenced, for example.

Specific examples of the metal alkoxide include tetramethoxy silane, tetraethoxy silane, tetraisopropoxy silane, trimethoxy aluminum, triethoxy aluminum, triisopropoxy aluminum, tetramethoxy titanium, tetraethoxy titanium, tetraisopropoxy titanium, tetramethoxy zirconium, tetraethoxy zirconium, tetraisopropoxy zirconium, tetraethoxy tin, dimethoxy zinc, and diethoxy zinc. The metal alkoxide is preferably at least one selected from the group consisting of these, and is more preferably at least one selected from the group consisting of tetramethoxy silane, tetraethoxy silane, tetraisopropoxy silane, trimethoxy aluminum, triethoxy aluminum, and triisopropoxy aluminum. One type of metal alkoxide may be used alone, or two or more types may be used in combination.

The addition amount of the metal alkoxide used in the surface treatment step may be, for example, in a range from 5 mass % to 110 mass %, and preferably 15 mass % or greater, or 25 mass % or greater, and preferably 90 mass % or less or 75 mass % or less, relative to the total mass of the fluoride particles.

Examples of the liquid medium include water; alcohol-based solvents such as methanol, ethanol, and isopropyl alcohol; nitrile-based solvents such as acetonitrile; and hydrocarbon-based solvents such as hexane. The liquid medium may contain at least water and an alcohol-based solvent. When the liquid medium contains an alcohol-based solvent, the content of the alcohol-based solvent in the liquid medium may be, for example, 60 mass % or greater, and preferably 70 mass % or greater. Furthermore, the content of water in the liquid medium may be, for example, in a range from 4 mass % to 40 mass %.

The liquid medium may further contain a pH adjusting agent. Examples of the pH adjusting agent include an alkaline substance such as ammonia, sodium hydroxide, and potassium hydroxide, and an acidic substance such as hydrochloric acid, nitric acid, sulfuric acid, and acetic acid. When the liquid medium contains a pH adjusting agent, in acidic conditions, the pH of the liquid medium may be, for example, in a range from 1 to 6, and preferably from 2 to 5. In alkaline conditions, the pH of the liquid medium may be in a range from 8 to 12, and preferably from 8 to 11.

The mass ratio of the liquid medium to the fluoride particles may be, for example, in a range from 100 mass % to 1000 mass %, preferably 150 mass % or higher or 180 mass % or higher, and preferably 600 mass % or lower or 300 mass % or lower. When the mass ratio of the liquid medium is within the range described above, the fluoride particles tend to be more uniformly covered with oxides.

Contact between the fluoride particles and the metal alkoxide can be implemented by, for example, adding the metal alkoxide to a suspension containing the fluoride particles. When necessary, stirring or the like may be implemented at that time. Furthermore, the contact temperature of the fluoride particles and the metal alkoxide may be, for example, in a range from 0° C. to 70° C., and preferably from 10° C. to 40° C. The contact time may be, for example, in a range from 1 hour to 12 hours. Note that the time required for addition of the metal alkoxide is also included in the contact time.

In a case in which the inorganic substance that is adhered in the surface treatment step is metal salt, for example, the metal salt can be adhered to at least a portion of the surface of the fluoride particles by causing the fluoride particles, the metal ions, and anions to contact in a liquid medium. Specifically, when the metal salt is a rare earth phosphate, the fluoride particles, rare earth ions, and phosphate ions are brought into contact in a liquid medium. Through this, fluoride particles having a rare earth phosphate adhered to the surface are obtained. It is thought that by adhering a rare earth phosphate to the fluoride particles in a liquid medium, for example, the rare earth phosphate is adhered more uniformly to the surface of the fluoride particles, The liquid medium preferably contains phosphate ions, and more preferably contains water and phosphate ions. In a case in which the liquid medium contains phosphate ions, the prepared fluoride particles and the liquid medium are mixed, and then further mixed with a solution containing the rare earth ions, and thereby the phosphate ions and the rare earth ions can be brought into contact in the liquid medium containing the fluoride particles. In a case in which the liquid medium contains phosphate ions, the phosphate ion concentration in the liquid medium is, for example, 0.05 mass % or higher, preferably 0.1 mass % or higher, and, for example, 5 mass % or lower, and preferably 3 mass % or lower. When the phosphate ion concentration in the liquid medium is greater than or equal to the lower limit described above, the amount of the liquid medium is not excessive, elution of the composition components from the fluoride particles is suppressed, and the characteristics of the fluoride phosphor tend to be favorably maintained. When the phosphate ion concentration is less than or equal to the upper limit described above, uniformity of matter adhered on the fluoride particles tends to be favorable.

Phosphate ions include ortho-phosphate ions, polyphosphate (meta-phosphate) ions, phosphite ions, and hypophosphite ions. Polyphosphate ions include polyphosphate ions having a linear structure, such as pyrophosphate ions and tripolyphosphate ions, and cyclic polyphosphate ions, such as hexa-meta-phosphate ions.

In a case in which the liquid medium contains phosphate ions, a compound that serves as a source of phosphate ions may be dissolved in the liquid medium, or a solution containing a phosphate ion source may be mixed with the liquid medium and prepared. Examples of the phosphate ion source include: phosphoric acid; meta-phosphoric acid; alkali metal phosphates such as sodium phosphate and potassium phosphate; alkali metal hydrogen phosphates such as sodium hydrogen phosphate and potassium hydrogen phosphate; alkali metal dihydrogen phosphates such as sodium dihydrogen phosphate and potassium dihydrogen phosphate; alkali metal hexa-meta-phosphates such as sodium hexa-meta-phosphate and potassium hexa-metaphosphate; alkali metal pyrophosphates such as sodium pyrophosphate and potassium pyrophosphate; and ammonium phosphates such as ammonium phosphate.

The liquid medium preferably contains a reducing agent, more preferably contains water and a reducing agent, and even more preferably contains water, phosphate ions, and a reducing agent. When the liquid medium contains a reducing agent, precipitation of manganese dioxide or the like derived from manganese contained in the fluoride particles can be effectively suppressed. The reducing agent contained in the liquid medium is preferably one which, for example, can reduce tetravalent manganese ions eluted from the fluoride particles into the liquid medium, and examples include hydrogen peroxide, oxalic acid, and hydroxylamine hydrochloride. Of these, hydrogen peroxide decomposes in water and thus does not adversely affect fluoride, and therefore hydrogen peroxide is preferable.

In a case in which the liquid medium contains a reducing agent, a compound that serves as a reducing agent may be dissolved in the liquid medium, or a solution containing a reducing agent may be mixed with the liquid medium and prepared. The content of the reducing agent in the liquid medium is not particularly limited, but for example, the content may be 0.1 mass % or higher, and preferably 0.3 mass % or higher.

Examples of rare earth elements that become rare earth ions that contact the phosphate ions include, in addition to Sc and Y, lanthanoids including La, Ce, Pr, Nd, Pm, Sm, Eu, Gd, Tb, Dy, Ho, Er, Tm, Yb, and Lu, and the rare earth element is preferably at least one selected from the lanthanoids, and more preferably at least one selected from the group consisting of La, Ce, Dy, and Gd.

Contact between the phosphate ions and the rare earth ions in the liquid medium may be caused, for example by dissolving a compound that serves as a rare earth ion source in a liquid medium containing phosphate ions, or by mixing a liquid medium containing phosphate ions with a solution containing rare earth ions. The solution containing rare earth ions can be prepared, for example, by dissolving a compound that serves as a rare earth ion source in a solvent such as water. The compound that serves as a rare earth ion source is, for example, a metal salt containing a rare earth element, and examples of the anion constituting the metal salt include nitrate ions, sulfate ions, acetate ions, and chloride ions.

Contact between the phosphate ions and the rare earth ions in the liquid medium can include, for example, obtaining a phosphor slurry by mixing fluoride particles with a liquid medium containing phosphate ions and preferably further containing a reducing agent, and mixing the phosphor slurry with rare earth ions.

In the liquid medium in which the phosphate ions and the rare earth ions are in contact, the content of the rare earth ions is, for example, 0.05 mass % or greater or 0.1 mass % or greater, and also, for example, 3 mass % or less or 2 mass % or less. Furthermore, the content of the rare earth ions relative to the amount of fluoride particles in the liquid medium is, for example, 0.2 mass % or greater or 0.5 mass % or greater, and also, for example, 30 mass % or less or 20 mass % or less. When the concentration of the rare earth ions is greater than or equal to the lower limit described above, the adherence ratio of the rare earth phosphate to the fluoride particles tends to be further improved. When the concentration of the rare earth ions is less than or equal to the upper limit described above, the rare earth phosphate tends to be easily adhered more uniformly to the surfaces of the fluoride particles.

The contact temperature between the rare earth ions and the phosphate ions forming the rare earth phosphate is, for example, in a range from 10° C. to 50° C., and preferably from 20° C. to 35° C. In addition, the contact time is, for example, in a range from 1 minute to 1 hour, and preferably from 3 minutes to 30 minutes. The contact may be implemented while stirring the liquid medium. For details on the method for adhering the rare earth phosphate to the surface of the fluoride particles, JP 2017-186524 A or the like can be referenced, for example.

In a case in which the inorganic substance that is adhered in the surface treatment step is fluoride, for example, the fluoride can be adhered to at least a portion of the surface of the fluoride particles by causing the fluoride particles, the metal ions, and fluoride ions to contact in a liquid medium.

In a case in which the fluoride that is adhered is a fluoride containing a Group 2 element, such as magnesium fluoride or calcium fluoride, the fluoride particles, the Group 2 metal ions and the fluoride ions are brought into contact in a liquid medium, and thereby fluoride particles can be obtained with a fluoride containing a Group 2 element adhered on the surface. For details on the method for adhering a fluoride containing a Group 2 element, reference can be made to, for example, JP 2015-044951 A.

Also, in a case in which the fluoride that is adhered is an alkali metal fluorosilicate, the fluoride particles, the fluorosilicate ions, and the alkali metal ions are brought into contact in a liquid medium, and thereby fluoride particles can be obtained with an alkali metal fluorosilicate adhered on the surface. For details on the method for adhering the alkali metal fluorosilicate, reference can be made to JP 2015-28148 A, for example.

In the surface treatment step, two or more types of inorganic substances may be adhered to the fluoride particles. For example, the surface treatment step may include adhering a rare earth phosphate to the fluoride particles, and adhering an oxide to the fluoride particles to which the rare earth phosphate has been adhered.

The method for manufacturing a fluoride phosphor may further include, after the surface treatment step, additional steps such as a step of recovering the obtained fluoride phosphor through solid-liquid separation, and a step of drying the solid-liquid separated fluoride phosphor.

The method for manufacturing a fluoride phosphor may include a coupling treatment step in which the fluoride phosphor obtained in the surface treatment step is treated with a coupling agent. In the coupling treatment step, a surface treatment layer including a functional group derived from the coupling agent can be provided on the surface of the fluoride phosphor by bringing the fluoride phosphor and the coupling agent into contact. Through this, for example, moisture resistance of the fluoride phosphor is improved.

Examples of the functional group derived from the coupling agent include a silyl group having an aliphatic group with from 1 to 20 carbons, and preferably a silyl group having an aliphatic group with from 6 to 12 carbons. The functional group derived from the coupling agent may be a single type, or may be a combination of two or more types.

Specific examples of the coupling agent include a silane coupling agent, a titanium coupling agent, and an aluminum coupling agent. Examples of the silane coupling agent include alkyl trialkoxysilanes, such as methyl trimethoxysilane, ethyl trimethoxysilane, propyl trimethoxysilane, hexyl trimethoxysilane, octyl trimethoxysilane, decyl trimethoxysilane, and decyl triethylsilane; and aryl trialkoxysilanes, such as phenyl trimethoxysilane, and styryl trimethoxysilane, and the silane coupling agent may be at least one selected from the group consisting of these. From the perspective of being able to relatively easily procure the coupling agent, the coupling agent is preferably a silane coupling agent.

The amount of the coupling agent used in the coupling treatment step may be, for example, in a range from 0.5 mass % to 10 mass %, and preferably from 1 mass % to 5 mass %, relative to the mass of the fluoride phosphor. The contact temperature between the fluoride phosphor and the coupling agent may be, for example, in a range from 0° C. to 70° C., and preferably from 10° C. to 40° C. Furthermore, the contact time between the fluoride phosphor and the coupling agent may be, for example, in a range from 1 minute to 10 hours, and preferably from 10 minutes to 1 hour.

Quantum Dots

The quantum dots include at least one selected from the group consisting of a first crystalline nanoparticle and a second crystalline nanoparticle. The quantum dots may further include other quantum dots other than the first crystalline nanoparticle and the second crystalline nanoparticle. Examples of other quantum dots include semiconductor quantum dots such as (Cd, Zn) (Se, S) and InP-based semiconductor quantum dots.

In addition, a median diameter of the first crystalline nanoparticle may be, for example, in a range from 3 nm to 15 nm, and is preferably 4 nm or greater or 5 nm or greater, and also preferably 13 nm or less, or 11 nm or less.

The median diameter of the first crystalline nanoparticle is measured using a transmission electron microscope (TEM) image of the first crystalline nanoparticle as described below. Specifically, of line segments passing through the interior of a certain particle observed in a TEM image, the line segments thereof connecting any two points on the outer perimeter of the particle, the length of the longest line segment is used as the particle size of the particle.

However, when the particle has a rod shape, the length of the minor axis is considered to be the particle size. Here, a rod-shaped particle means a particle having a major axis orthogonal to a minor axis in a TEM image and for which a ratio of the length of the major axis to the length of the minor axis is greater than 1.2. A rod-shaped particle is observed in a TEM image as, for example, a quadrilateral shape including a rectangular shape, an elliptical shape, or a polygon shape. The shape of a cross-section that is a surface orthogonal to the major axis of the rod shape may be, for example, a circle, an ellipse, or a polygon. Specifically, with a rod-shaped particle, in the case of an elliptical shape, the length of the major axis refers to the length of the longest line segment of the line segments connecting any two points on the outer perimeter of the particle, and in the case of a rectangular or polygonal shape, the length of the major axis refers to the length of the longest line segment of the line segments connecting any two points on the outer perimeter of the particle, the line segment thereof also being parallel to the longest side of the sides defining the outer perimeter. The length of the minor axis refers to the length of the longest line segment of the line segments connecting any two points on the outer perimeter, the line segment thereof also being orthogonal to the line segment defining the length of the major axis.

The median diameter of the first crystalline nanoparticle is obtained by measuring the particle size of all measurable particles observed in TEM images magnified in a range from 50000 times to several 1000000 times, and then determining the particle size distribution on a volume basis. The volume of the particles can be calculated by spherical approximation on the basis of the outer diameter of the particles being measured. A particle size corresponding to a cumulative volume of 50% from the small diameter side in the particle size distribution is defined as the median diameter. Here, measurable particles are those particles for which the entire particle can be observed in a TEM image. Therefore, in a TEM image, a particle for which a portion is not included in the imaging range and is cut off is not considered to be measurable. When the number of measurable particles included in one TEM image is 100 or more, the average particle size is determined using that TEM image. On the other hand, when the number of measurable particles included in one TEM image is less than 100, the imaging location is changed, and another TEM image is captured, and the median diameter is determined by measuring the particle size of 100 or more measurable particles included in the two or more TEM images.

The first crystalline nanoparticle contains: a cation J including at least one selected from the group consisting of alkali metal ions, ammonium, methylammonium, formamidinium, guanidium, imidazolium, pyridinium, pyrrolidium, and protonated thiourea; a metal L including at least one selected from the group consisting of germanium, tin, lead, antimony, and bismuth; and an anion X including at least one selected from the group consisting of halogen ions, cyanide ions, thiocyanate ions, isothiocyanate ions, and sulfide ions, The alkali metal ions of the cation J may include at least one selected from the group consisting of a lithium ion ($Li^+$), a sodium ion ($Na^+$), a potassium ion ($K^+$), a rubidium ion ($Rb^+$) and a cesium ion ($Cs^+$), and preferably include at least a cesium ion. The cation J may preferably include at least one selected from the group consisting of alkali metal ions, methylammonium, and formamidinium (hereinafter, abbreviated as FA), and may more preferably include at least one selected from the group consisting of cesium ions, methylammonium, and formamidinium.

The metal L may preferably include at least one of at least tin and lead, and may more preferably include at least lead. The halogen ions of the anion X may include at least one selected from the group consisting of a fluorine ion ($F^-$), a chlorine ion ($Cl^-$), a bromine ion ($Br^-$), and an iodine ion ($I^-$), and preferably may include at least one selected from the group consisting of a chlorine ion, a bromine ion, and an iodine ion. The anion X may include at least one selected from the group consisting of a bromine ion and an iodine ion, and more preferably includes a bromine ion.

When the number of moles of the cation J is 1, the composition of the first crystalline nanoparticle may be such that the number of moles of the metal L is in a range from 0.9 to 1.1, and preferably from 0.95 to 1.05. In addition, when the number of moles of the cation J is 1, the number of moles of the anion X may be in a range from 2.7 to 3.3, and preferably from 2.8 to 3.2. The composition of the first crystalline nanoparticle may be a stoichiometric composition in which, relative to the number of moles of the cation J, the number of moles of the metal L is 1 and the number of moles of the anion X is 3, or may be a non-stoichiometric composition.

The first crystalline nanoparticle may have a composition represented by Formula (3) below, for example.

$$J_p L_q X_r \tag{3}$$

In Formula (3), J may include at least one selected from the group consisting of alkali metal ions, ammonium, methylammonium, formamidinium, guanidium, imidazolium, pyridinium, pyrrolidium, and protonated thioureas, preferably at least one selected from the group consisting of alkali metal ions, methyl ammonium, and formamidinium, and more preferably at least one selected from the group consisting of cesium ions, methyl ammonium, and formamidinium.

L may include at least one selected from the group consisting of germanium, tin, lead, antimony, and bismuth, preferably at least one of tin and lead, and more preferably at least lead.

X may include at least one selected from the group consisting of halogen ions, cyanide ions, thiocyanate ions, isothiocyanate ions, and sulfide ions, preferably at least one selected from the group consisting of halogen ions and sulfide ions, and more preferably at least one selected from the group consisting of chlorine ions, bromine ions, and iodine ions.

In Formula (3), p may be a number in a range from 0.9 to 1.1, and preferably from 0.95 to 1.05. Furthermore, q may be a number in a range from 0.9 to 1.1, and preferably from 0.95 to 1.05. Moreover, r may be a number in a range from 2.7 to 3.3, and preferably from 2.8 to 3.2.

The first crystalline nanoparticle may have a perovskite structure. The perovskite structure itself is known and may be a cubic crystal represented by the formula $JLX_3$, a pseudo-cubic crystal, a tetragonal crystal or an orthorhombic crystal. J is a cation with a coordination number of 12, L is a cation with a coordination number of 6, and X is an anion positioned in a lattice of the cubic, pseudo-cubic, tetragonal or orthorhombic crystal. In these structures, a selected cation or anion may be substituted with another ion while maintaining the original crystalline structure. When irradiated with light having a wavelength of 450 nm, for example, the first crystalline nanoparticle preferably exhibits light emission having an emission peak in a wavelength range from 510 nm to 535 nm, and preferably from 520 nm to 530 nm. The full width at half maximum of the emission peak of the first crystalline nanoparticle may be in a range from 10 nm to 30 nm, and preferably from 15 nm to 25 nm.

The first crystalline nanoparticles can be manufactured by a known manufacturing method. Specifically, the first crystalline nanoparticle can be manufactured with reference, for example, to the details disclosed in Nano Letter, 2015, Vol. 15, pp. 3692 to 3696 and JP 2018-530633 A.

The second crystalline nanoparticle includes a chalcopyrite-type crystalline structure, and a full width at half maximum of the emission peak of the second crystalline nanoparticle is 45 nm or less. Examples of crystalline nanoparticles including a chalcopyrite-type crystalline structure include crystalline nanoparticles containing a compound represented by the compositional formula (Ag, Cu, Au) (In, Ga) (S, Se, Te)$_2$ having, for example, a tetragonal crystalline structure. Regarding the crystalline nanoparticles including the chalcopyrite-type crystalline structure as quantum dots, reference can be made to specifically the compounds disclosed in JP 6464215 B and JP 2019-085575 A.

A second crystalline nanoparticle including a chalcopyrite-type crystalline structure emits light due to light from an excitation light source. The second crystalline nanoparticle is excited by light from an excitation light source having an emission peak wavelength in a range from 380 nm to 500 nm, and may emit light having, for example, an emission peak wavelength in a range from greater than 510 nm to 580 nm. The emission peak wavelength of the second crystalline nanoparticle may be within a range from 510 nm to 550 nm, or within a range from 515 nm to 545 nm. The full width at half maximum in the emission spectrum of the second crystalline nanoparticle may be, for example, 45 nm or less, 40 nm, or less, or 35 nm or less. When light having an emission spectrum with a relatively wide full width at half maximum is emitted, the color appearance (hereinafter, also referred to as a "color rendering property") of an object when irradiated with light is excellent.

The median diameter of the second crystalline nanoparticle may be, for example, in a range from 1 nm to 20 nm, preferably from 3 nm to 10 nm, or from 4 nm to 7 nm. The median diameter of the second crystalline nanoparticle is measured in the same manner as the median diameter of the first crystalline nanoparticle.

The quantum dots contained in the wavelength conversion layer may be a single type, or may be a combination of two or more types. The content of the quantum dots in the wavelength conversion layer may be adjusted, as appropriate, according to the chromaticity of the light emitted by the wavelength conversion member. Specifically, for example, the content of the quantum dots may be in a range from 0.1 parts by mass to 0.4 parts by mass, and preferably from 0.15 parts by mass to 0.35 parts by mass, relative to 100 parts by mass of the resin. Furthermore, a mass ratio of the content of the quantum dots to the content of the fluoride phosphor in the wavelength conversion layer may be in a range from 0.2% to 10%, and preferably from 0.25% to 8%.

Surfactant

The wavelength conversion layer contains at least one type of surfactant. The surfactant can be selected from nonionic surfactants, cationic surfactants, anionic surfactants, and amphoteric surfactants. One type of surfactant may be used alone, or two or more types may be used in combination. When two or more types of surfactants are used, for example, an amphoteric surfactant and a nonionic surfactant can be used in combination. The surfactant may be applied, for example, to the surface of the quantum dots and used. The surfactant may be, for example, a surface modifier of the quantum dots.

In one aspect, the surfactant may have an alkyl group or an alkyl ether group having from 4 to 30 carbons. The number of carbons of the alkyl group or the alkyl ether group may be preferably in a range from 6 to 24, and more preferably from 8 to 20.

In one aspect, the surfactant may be an ether compound having a polyalkyleneoxy group formed from an alkyleneoxy unit having from 2 to 3 carbons. The number of alkyleneoxy units may be, for example, in a range from 2 to 20. The surfactant may be ether-bonded with an alkyl group having from 1 to 5 carbons.

Examples of the nonionic surfactant include maleic-based polymers such as poly(maleic anhydride-ALT-1-octadecene); alkyl (poly)amines such as N-alkyl-1,3-propylenediamine, N-alkyldipropylene-triamine, N-alkyltripropylene-tetraamine, N-alkylpolypropylene-polyamine, and polyethylene imine; polyesters; alkyl fatty acid esters such as cetyl palmitate; alkyl polyglycol ethers such as fatty alcohol polyglycol ethers having from 3 to 25 ethyleneoxy units (EO); oxo-alcohol polyglycol ethers; mixed alkyl/aryl polyglycol ethers; aliphatic alcohols such as alkyl polyglucoside (APG) and stearyl alcohol; and N-acylamides such as N-oleoyl-γ-aminobutyric acid.

Other examples of nonionic surfactants also include polyethyleneoxy/polypropyleneoxy (EO/PO) adducts. EO/PO adducts include alcohol EO/PO adducts such as aliphatic alcohol EO/PO adducts and oxo-alcohol EO/PO adducts, EO/PO block copolymers, ethylene diamine EO/PO block copolymers, aliphatic alcohol EO adducts and EO/PO adducts, carboxylates, and sorbitan esters. Other examples of nonionic surfactants include alkoxysilanes and hydrolysates thereof.

Further examples of the nonionic surfactant include alkylphosphines such as trioctylphosphine, alkylphosphine oxides such as trioctylphosphine oxide, and alkylthiols having from 4 to 30 carbons.

Further examples of the nonionic surfactant include alkyl esters of fatty acids, such as palmitic acid, lauric acid, and capric acid. Preferred nonionic surfactants include, for example, alkylimines or alkylamines such as dioctyl amine, oleylamine, octadecylamine, and hexadecylamine.

Examples of the cationic surfactant include alkyl ammonium halides such as oleyl ammonium bromide, alkyl trimethylammonium halides such as cetyl trimethylammonium bromide, dialkyl dimethylammonium halides such as distearyl dimethylammonium chloride, trialkyl methylammonium halides such as trioctyl methylammonium chloride, and di-quaternary poly-dimethylsiloxane.

Amphoteric surfactants have a cationic moiety, an anionic moiety, and a hydrophobic group. Examples of the cationic moiety include an amine salt, a quaternary ammonium group, a sulfonium salt, and a phosphonium salt. Examples of the anionic moiety include carboxylates, sulfonates, sulfites, sulfates, phosphinates, phosphonates, phosphites, and phosphates. The amphoteric surfactant preferably includes a quaternary ammonium group as a cationic moiety, and may include a carboxylate, a sulfonate, a phosphonate, or the like as an anionic moiety.

Examples of the amphoteric surfactant include betaine, caprylic acid glycinate, cocamidopropyl betaine, disodium cocoamphodiacetate, 3-(N,N-dimethylalkylammonio)propane sulfonate, and alkylphosphoazanium amphoteric ions. For specific examples of amphoteric surfactants, JP 2019-526658 T can be referenced.

Examples of the anionic surfactant include sulfates, sulfonates, phosphates, and carboxylates. Specific examples include phosphates of alkyl ethers, ammonium lauryl sulfate, lauryl sulfate alkali salts, alkyl ether sulfate alkali salts, oleic acid, stearic acid, and palmitic acid, and other such fatty acids.

In one aspect, the anionic surfactant may be an alkyl ether of a polyalkyleneoxy acetic acid, the alkyl ether having from 1 to 5 carbons. The alkyleneoxy group may have carbons in a range from 2 to 3, and the number of repetitions of the alkyleneoxy group may be in a range from 0 to 5. The anionic surfactant may preferably be methoxydiethyleneoxy acetic acid.

The content of the surfactant in the wavelength conversion layer may be, for example, in a range from 0.01 parts by mass to 0.2 parts by mass, and preferably from 0.02 parts by mass to 0.18 parts by mass, relative to 100 parts by mass of the resin. Also for example, the content of the surfactant may be in a range from 5 mass % to 50 mass %, and preferably from 10 mass % to 45 mass %, relative to the content of the quantum dots.

Resin

The wavelength conversion layer contains at least one resin. The resin constituting the wavelength conversion layer may be a translucent resin that transmits visible light. Furthermore, the resin may be a thermosetting resin or a thermoplastic resin. Specific examples of the resin include acrylic resins, carbonate resins, sulfone resins, epoxy resins, urethane resins, ester resins, silicone resins, styrene resins, vinyl resins, and olefin-based resins such as cyclic olefin resins, and the resin may include at least one selected from the group consisting of these resins. The resin preferably may include at least one selected from the group consisting of acrylic resins, silicone resins, and epoxy resins. The resin contained in the wavelength conversion layer may be a single type or a combination of two or more types.

Spherical Particles

The wavelength conversion layer may also further contain spherical particles. When spherical particles are contained, the thickness of the wavelength conversion layer becomes more uniform, and uniformity of the luminescent color tends to be further improved. Here, a spherical particle means a particle having a sphericity of 5 µm or less. The sphericity is defined by JIS B 1501 as a maximum value in the radial direction between the smallest spherical surface contacting the surface of a steel ball and each point on the surface of the steel sphere. The sphericity is preferably 2.5 µm or less, more preferably 1.5 µm or less, and most preferably 1 µm or less.

The median diameter of the spherical particles may be, for example, in a range from 10 µm to 100 µm, and is preferably from 20 µm to 60 µm. The median diameter of the spherical particles is measured as a particle size corresponding to a cumulative volume of 50% from the small diameter side in a particle size distribution on a volume basis.

The particle size distribution of the spherical particles may be a single peak. The particle size distribution of the spherical particles is preferably a single peak particle size distribution having a narrow distribution width. Specifically, in the particle size distribution of the spherical particles, a coefficient of variation (CV value; %), which is a value obtained by dividing the standard deviation of the particle size by the median diameter and then multiplying the result by 100, may be, for example, 6% or less, and preferably 3% or less, or 1% or less.

Examples of the material of the spherical particle include silicon oxide, zirconium oxide, aluminum oxide, glass, and resin, and the material thereof may be at least one selected from the group consisting of these. The material of the spherical particle may preferably be at least one selected from the group consisting of silicon oxide, zirconium oxide, silicon oxide-containing glass, acrylic resin, and silicone resin.

The content of the spherical particles in the wavelength conversion layer may be, for example, in a range from 0.1 parts by mass to 20 parts by mass, preferably 0.5 parts by mass or greater or 1 part by mass or greater, and also preferably 15 parts by mass or less or 10 parts by mass or less, relative to 100 parts by mass of the resin.

The wavelength conversion member may further contain a light-diffusing material in the wavelength conversion layer. When a light-diffusing material is contained, directivity from the light-emitting element can be alleviated, and a viewing angle can be increased. Examples of the light-diffusing material include silicon oxide, titanium oxide, zinc oxide, zirconium oxide, and aluminum oxide.

The wavelength conversion layer may be formed in a sheet shape having two main surfaces orthogonal to the thickness direction and a side surface that surrounds the outer edges of the two main surfaces and is parallel to the thickness direction. An average thickness of the wavelength conversion layer may be, for example, in a range from 10 µm to 100 µm, and preferably 20 µm or greater or 30 µm or greater, and also preferably 80 µm or less or 60 µm or less. The average thickness of the wavelength conversion layer is calculated as an arithmetic mean of thickness measurements at 16 locations in a cross section orthogonal to the main surfaces of the wavelength conversion layer. Specifically, when the wavelength conversion member has a below-described base material, the thickness of the wavelength conversion member is measured at one location per every two square centimeters of the surface area within the surface of the wavelength conversion member, and the thickness of the base material that is used is subtracted from the thickness of the wavelength conversion member to thereby calculate the thickness of the wavelength conversion layer.

The range of fluctuation in the thickness of the wavelength conversion layer may be 12% or less, and preferably 10% or less or 8% or less, relative to the average thickness of the wavelength conversion layer. The range of fluctuation in the thickness of the wavelength conversion layer is calculated by subtracting a minimum thickness value from a maximum thickness value of the thicknesses measured when calculating the average thickness of the wavelength conversion layer, dividing the obtained value by the average thickness, and then multiplying the result by 100.

The wavelength conversion member may further include a base material that supports the wavelength conversion layer. When such a base material is provided, for example, a wavelength conversion member better excelling in durability and exhibiting excellent handling properties can be configured. The base material may have a sheet-like shape having two mutually opposing main surfaces orthogonal to the thickness direction and a side surface that surrounds the outer edges of the two main surfaces and is parallel to the thickness direction. The main surfaces of the base material may, for example, oppose the main surfaces of the wavelength conversion layer and cover the main surfaces of the wavelength conversion layer. Additionally, the base material may be disposed on one main surface of the wavelength conversion layer, or may be disposed on both of the two main surfaces of the wavelength conversion layer such that the base materials sandwich the wavelength conversion layer.

Examples of the material of the base material include polyethylene terephthalate resin, acrylic resin, polyester resin, and glass. The thickness of the base material may be, for example, in a range from 20 µm to 200 µm, and preferably 25 µm or greater or 30 µm or greater, and also preferably 150 µm or less or 120 µm or less. The base material may be a translucent base material that is permeable to visible light. The light transmittance of the base material may be, for example, 80% or greater in the visible light region, and preferably 85% or greater.

The base material may have an oxide layer on the surface thereof. When the base material has an oxide layer, the permeability of oxygen, water vapor, and the like can be further reduced, and a wavelength conversion member having superior durability can be configured. Examples of the oxide include silicon oxide, aluminum oxide, and zirconium oxide. The thickness of the oxide layer may be, for example, in a range from 0.1 µm to 5 µm, and preferably from 0.2 µm to 2 µm. The oxide layer may be provided on one surface of the base material or may be provided on both surfaces.

The water vapor permeability of the base material is preferably low. Through this, a wavelength conversion member excelling in durability can be configured. At a temperature of 40° C. and a relative humidity of 90%, the water vapor permeability of the base material may be, for example, 1 g/m$^2$·day or less, preferably 0.5 g/m$^2$·day or less, or 0.1 g/m$^2$·day or less.

The wavelength conversion member may further include a sealing member that surrounds the outer peripheral section of the wavelength conversion layer sandwiched by the two base materials and seals the wavelength conversion layer. The sealing member may seal the wavelength conversion layer through, for example, a tacky adhesive layer or an adhesive layer. Through this, a wavelength conversion member better excelling in durability can be configured. Examples of the material of the sealing member include resin, glass, and metal. The thickness of the sealing member may be, for example, in a range from 1 µm to 200 µm, and preferably from 5 µm to 100 µm.

The water vapor permeability of the sealing member is preferably low. At a temperature of 40° C. and a relative humidity of 90%, the water vapor permeability of the sealing member may be, for example, 10 g/m$^2$·day or less, preferably 5 g/m$^2$·day or less, or 1 g/m$^2$·day or less.

The wavelength conversion member may be provided with a porous film having a honeycomb structure, and the wavelength conversion layer may be formed in pore portions of the porous film. Through this, a wavelength conversion member better excelling in durability can be configured. The disclosures of JP 2002-347107 A and JP 2007-2241 A, for example, can be referenced for details on porous films having a honeycomb structure.

Examples of the material of the porous film having the honeycomb structure and provided in the wavelength conversion member include acrylic resin or the like. Furthermore, the pore portion of the porous film having a honeycomb structure may be, for example, in a range from 10 µm to 1 mm, and preferably from 50 µm to 500 µm.

When irradiated with light having an emission peak in a wavelength range of, for example, from 420 nm to 480 nm, the wavelength conversion member can emit light in a wavelength range from greater than 480 nm to 650 nm. The light emitted from the wavelength conversion member may be such that, for example, an x-value of the CIE chromaticity coordinates is in a range from 0.355 to 0.595, and preferably from 0.360 to 0.590, and a y-value thereof is in a range from 0.404 to 0.639, and preferably from 0.410 to 0.630.

Here, an example of a configuration of the wavelength conversion member will be described with reference to the drawings. FIG. 1 is schematic cross-sectional view illustrating an example of a wavelength conversion member. A wavelength conversion member 100 is provided with: a wavelength conversion layer 11 containing a fluoride phosphor, quantum dots, a surfactant, and a resin; and two base materials 12, 13 sandwiching the wavelength conversion layer 11. In FIG. 1, a sealing member 14 is disposed at an outer peripheral section of the wavelength conversion layer 11 and base materials 12, 13, and thereby seals the wavelength conversion layer 11. The sealing member 14 has a sealing base material 141 that seals, through an adhesive layer 142, the outer peripheral section of the base materials 12, 13 and end portions of the wavelength conversion layer 11.

The wavelength conversion member can be manufactured by, for example, a manufacturing method like that described below. The method for manufacturing the wavelength conversion member may include preparing a resin composition having fluidity and containing a fluoride phosphor, quantum dots, and an uncured resin raw material, applying the prepared resin composition onto one surface of the base material to form a resin composition layer thereon, and forming a wavelength conversion layer by curing the resin composition layer which was formed.

Examples of the uncured resin raw material contained in the resin composition include thermosetting silicone resins, photocurable acrylic monomers, epoxy monomers, and polyester resin raw materials. The content of the fluoride phosphor contained in the resin composition may be, for example, in a range from 25 parts by mass to 110 parts by mass, and preferably from 35 parts by mass to 100 parts by mass, relative to 100 parts by mass of the resin raw material.

The amount of the resin composition applied to the base material may be an amount such that the thickness of the wavelength conversion layer after curing is in a range from 10 μm to 100 μm, and preferably from 20 μm to 60 μm. A commonly used liquid application method such as a comma coater, a die coater, or a bar coater can be used as the method for applying the resin composition. Another base material may be further laminated on the resin composition layer formed on the base material. Through this, a wavelength conversion member better excelling in durability can be obtained.

The method of curing the resin composition layer formed on the base material may be selected, as appropriate, according to the type of resin raw material. For example, when the resin raw material is a thermosetting resin, a wavelength conversion layer is formed in which the resin composition layer is cured by, for example, heat treating at a temperature in a range from 140° C. to 160° C. for a length of time in a range from 2 hours to 2.5 hours. Moreover, when the resin raw material is photocurable, a wavelength conversion layer is formed in which the resin composition layer is cured by, for example, irradiating with light in a wavelength range from 350 nm to 400 nm.

Light-Emitting Device

A light-emitting device is provided with the wavelength conversion member described above and a light-emitting element. Color unevenness of light output from the light-emitting device can be effectively suppressed by providing the above-described wavelength conversion member containing the fluoride phosphor.

The light-emitting element may emit light having an emission peak wavelength in a wavelength range from 380 nm to 485 nm, which is a short wavelength range of visible light. The light-emitting element may be an excitation light source that excites a fluoride phosphor. The light-emitting element preferably has an emission peak wavelength within a range from 380 nm to 480 nm, more preferably has an emission peak wavelength within a range from 410 nm to 480 nm, and even more preferably has an emission peak wavelength within a range from 430 nm to 480 nm. A semiconductor light-emitting element is preferably used as the light-emitting element of the excitation light source. By using a semiconductor light-emitting element as an excitation light source, a stable light-emitting device that exhibits high efficiency and high output linearity with respect to an input and that is strong against mechanical impact can be obtained. As the semiconductor light-emitting element, for example, a semiconductor light-emitting element that uses a nitride-based semiconductor can be used. The full width at half maximum of the emission peak in the emission spectrum of the light-emitting element is preferably 30 nm or less, for example.

The light-emitting device is provided with, for example, a light-emitting element disposed on a base material, and a wavelength conversion member that converts the wavelength of some of the light from the light-emitting element and emits the converted light thereof to the outside. The light emitted from the light-emitting device becomes a mixed color of light from the light-emitting element and light that was subjected to wavelength conversion by the wavelength conversion member. The light emitted from the light-emitting device may be such that, for example, an x-value of the CIE chromaticity coordinates is in a range from 0.24 to 0.31, and preferably from 0.26 to 0.29, and a y-value thereof is in a range from 0.22 to 0.33, and preferably from 0.24 to 0.31.

Figure 2:
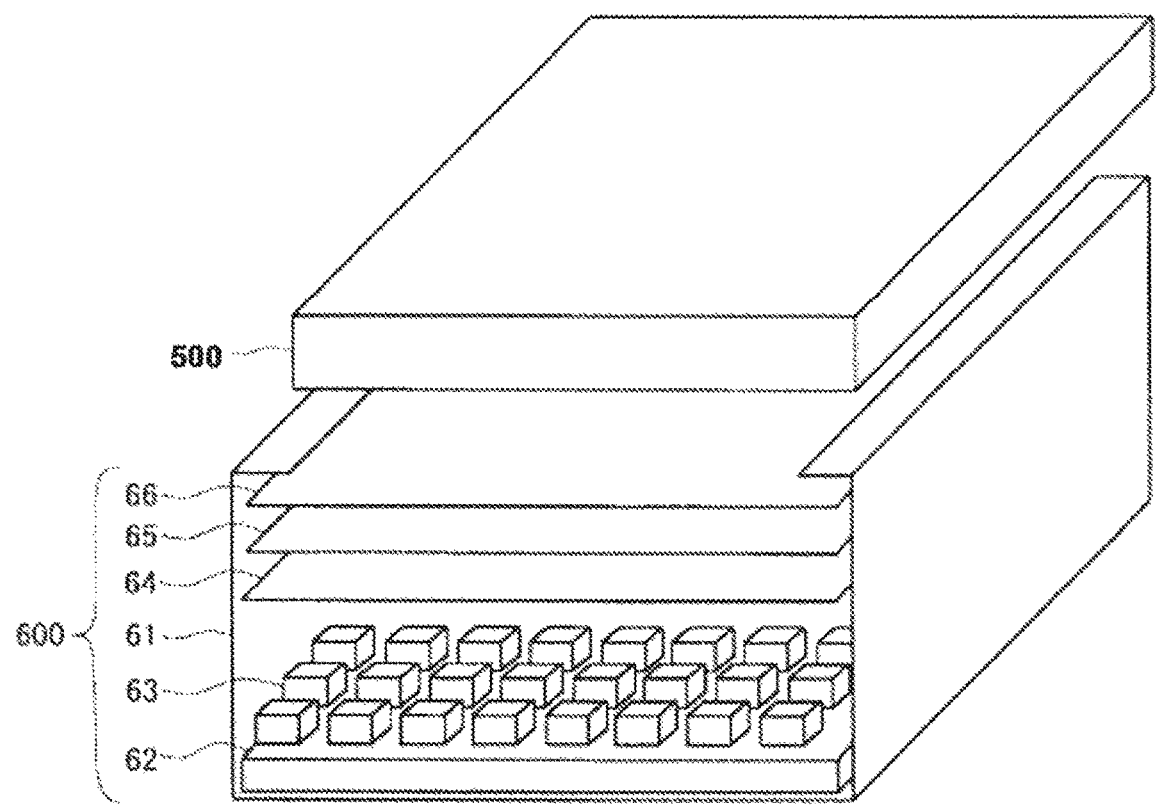
FIG. 2 is a schematic perspective view of an exemplary liquid crystal panel and an exemplary light-emitting device.
Figure 3:
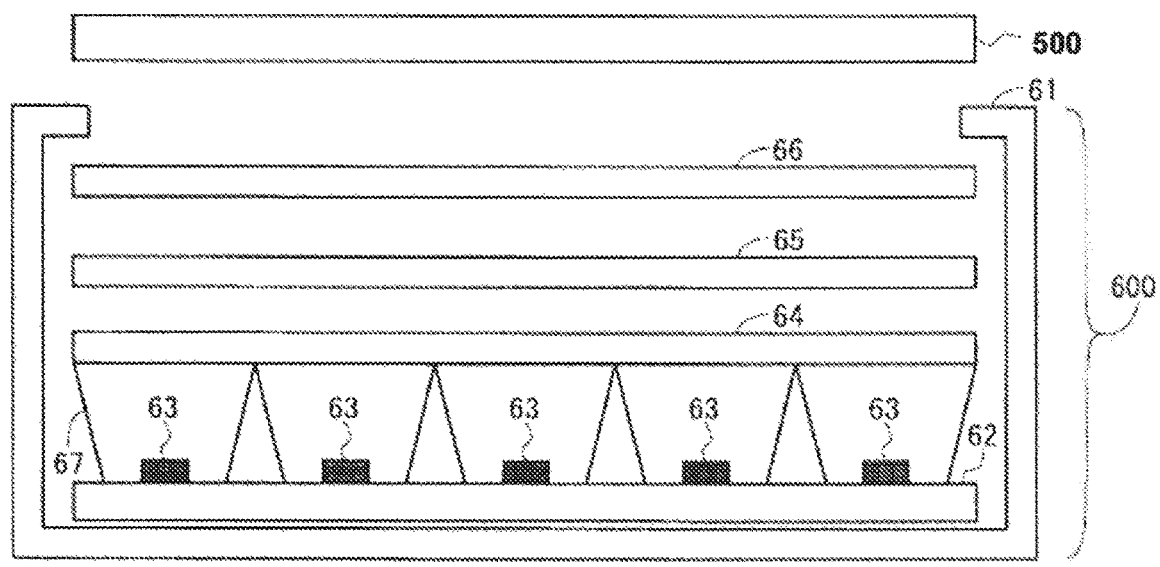
FIG. 3 is a schematic side view of the exemplary liquid crystal panel and the exemplary light-emitting device.

A configurational example of the light-emitting device is described with reference to the drawings. FIG. 2 is a schematic perspective view of a liquid crystal panel 500 and a light-emitting device 600. Moreover, FIG. 3 is a schematic side view of the liquid crystal panel 500 and the light-emitting device 600. Note that in FIG. 2, a reflecting partition 67 is not illustrated. The light-emitting device 600 is provided on a rear surface of the liquid crystal panel 500. In other words, the light-emitting device 600 according to the present embodiment is a directly below-type light-emitting device.

The light-emitting device 600 includes a chassis 61, an LED substrate 62, a plurality of light-emitting elements 63, a diffusion plate 64, a wavelength conversion member 65, an optical sheet 66, and the reflecting partition 67. The chassis 61 supports the LED substrate 62 and the like. The LED substrate 62 is, for example, a metal substrate, and includes a plurality of light-emitting elements (blue LEDs) 63. A reflection sheet is affixed to the surface of the LED substrate 62 to increase the usage efficiency of light emitted from the light-emitting elements 63. Each light-emitting element 63 is a light source of the light-emitting device 600 and emits blue light. The diffusion plate 64 is disposed at a position that is several mm to several cm above the light-emitting elements 63. The diffusion plate 64 diffuses light emitted from the light-emitting elements 63 such that light (also referred to as backlight) from the light-emitting device becomes light that is uniform from a surface perspective. The wavelength conversion member 65 is disposed above the diffusion plate 64. The wavelength conversion member 65 converts the wavelength of light emitted from the light-emitting elements 63 such that the backlight emitted from the light-emitting device 600 becomes white light. To accomplish this, the wavelength conversion member 65 contains green light-emitting quantum dots that emit yellow light when excited by light emitted from the light-emitting elements 63, and fluoride phosphors that emit red light when excited. The optical sheet 66 is disposed above the wavelength conversion member 65. The optical sheet 66 is generally configured by a plurality of sheets. Each of the plurality of sheets has functions such as a function of diffusing light, a light-condensing function, and a function of increasing the usage efficiency of light.

In an embodiment, a single LED unit is constituted of a plurality of light-emitting elements 63, and the single LED unit may correspond to one area. Reflecting partitions 67 are provided so as to surround the LED unit. In other words, each of the reflecting partitions 67 is provided so as to surround the plurality of light-emitting elements 63 constituting the LED unit. The surface of each reflecting partition 67 is formed of a reflective material. The height and angle of the reflecting partition 67 are designed such that light emitted from the light-emitting elements 63 corresponding to each area does not reach other areas. As illustrated in FIG. 3, an upper end portion of each reflecting partition 67 is in contact with the diffusion plate 64. In other words, a space inside the reflecting partitions 67 of each area is a closed space. By providing the reflecting partitions 67 so as to surround the LED unit, light emitted from the light-emitting elements 63 of each area does not reach other areas. In this way, the x-value and y-value of the chromaticity coordinates when the entire surface is lighted are substantially uniform over the entire screen.

Figure 4:
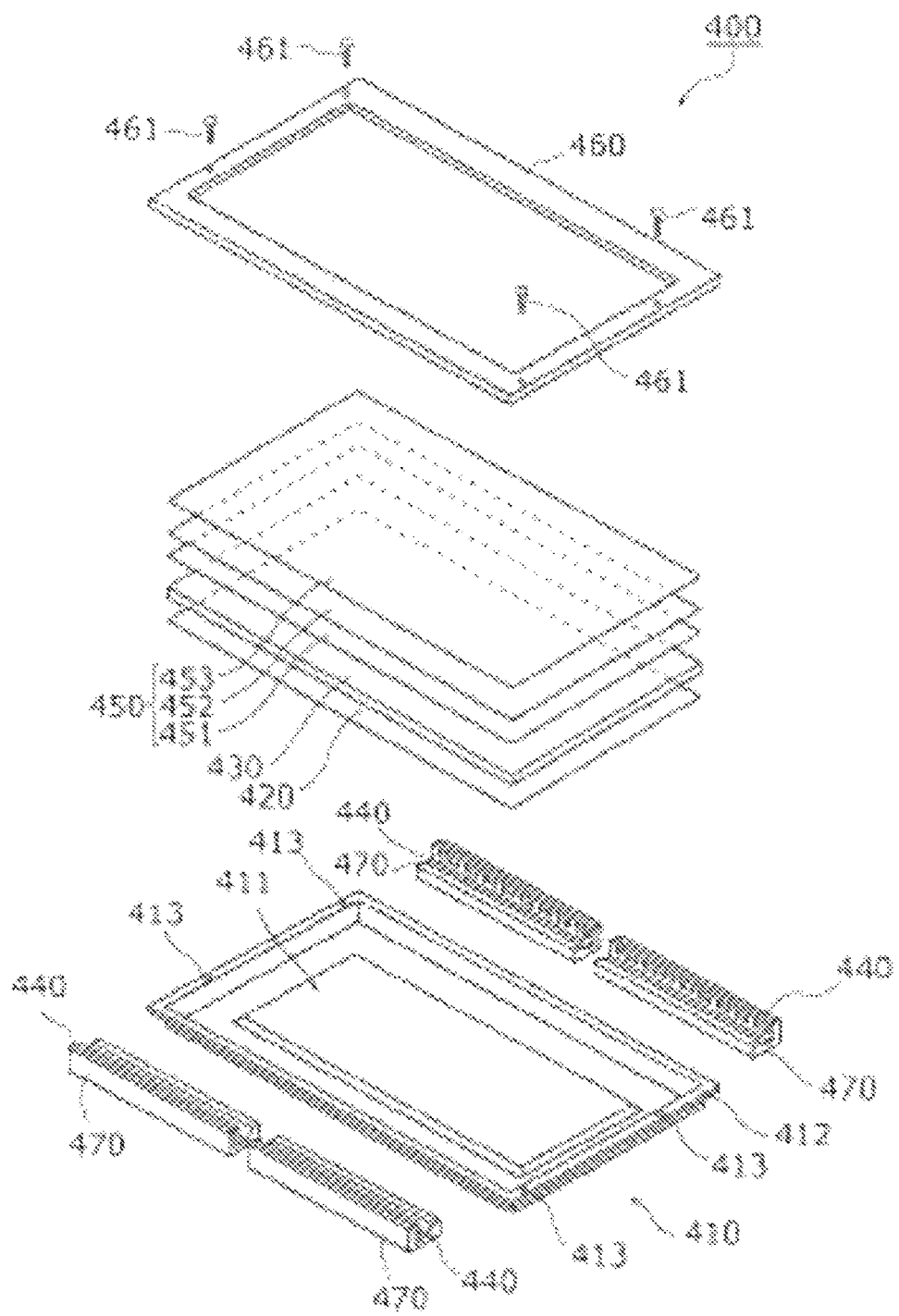
FIG. 4 is a schematic exploded perspective view of an exemplary backlight unit including an exemplary light-emitting device.

Another configurational example of the light-emitting device is described with reference to FIG. 4. FIG. 4 is a schematic exploded perspective view of a backlight unit including a light-emitting device according to an embodiment. An example in which the light-emitting device is used in a backlight unit for a liquid crystal display device is described with reference to FIG. 4. As illustrated in FIG. 4, a backlight unit 400 is an edge-light type backlight unit having a light source disposed on a side of a light guide plate, and is provided with a housing 410, a reflection sheet 420, a light guide plate 430, a light-emitting device 440, an optical sheet group 450, and a front surface frame 460.

The housing 410 is a flat box type, and is formed by pressing a steel sheet made from stainless steel or the like. The housing 410 has an opening 411 in a bottom surface, and a flange portion 412 is formed on an opening perimeter of the housing 410. Screw holes 413 for fastening the front surface frame 460 are formed in the flange portion 412.

The reflection sheet 420 is a sheet made of, for example, polyethylene terephthalate (PET), and causes white light from the light-emitting device to advance into the light guide plate 430 while being reflected.

The light guide plate 430 is, for example, a sheet made of polycarbonate (PC) or acrylic, and a dot pattern is printed on a main surface (rear surface) of the reflection sheet 420 side, the main surface being of the side opposite a light-emitting surface (front surface) thereof. The dot pattern is a light-collecting element for diffusing light incident on the light guide plate 430 and causing the light thereof to be emitted from the light-emitting surface. As the light-collecting element, prism shapes and light-scattering elements such as a light-scattering structure formed by printing and forming on the rear surface of the light guide plate 430, or light-scattering elements formed inside the light guide plate 430 can be used.

The optical sheet group 450 is configured from a diffusion sheet 451, a prism sheet 452, and a polarizing sheet 453, which are of the same size and same planar shape (rectangular). The diffusion sheet 451 is, for example, a film made from PET and a film made from PC. The prism sheet 452 is, for example, a sheet made from polyester, and a regular prism pattern is formed with an acrylic resin on one side. As the polarizing sheet 453, a film formed from polyethylene naphthalate is used, for example.

The front surface frame 460 is secured to the flange portion 412 of the housing 410 by screwing screws 461 into the screw holes 413 of the housing 410. The front surface frame 460 and the housing 410 sandwich the light guide plate 430 and the optical sheet group 450.

The light-emitting device 440 is provided with light-emitting elements and a wavelength conversion member disposed on the light-emitting elements. In the present embodiment, four light-emitting devices are used, and each is provided on a heat sink 470. Each light-emitting device 440 provided on a heat sink 470 is disposed such that the light-emitting surface faces a side surface of the light guide plate 430.

Each heat sink 470 holds a light-emitting device 440 and includes, for example, an extraction member (an angle member) formed from an L-shaped aluminum. The heat sink 470 is fixed to the housing 410 by screws or the like.

The backlight unit 400 according to the present embodiment uses a light-emitting device provided with light-emitting elements and a wavelength conversion member, and thus, a backlight unit with high light extraction efficiency can be realized without color unevenness and luminance unevenness.

Display Device

A display device is provided with the light-emitting device according to the present embodiment, and a surface area of a color reproduction range on a CIE chromaticity diagram is greater than or equal to 85% of a surface area of a color reproduction range defined by the BT2020 standard. The display device may be provided with a liquid crystal panel in addition to the light-emitting device. As illustrated in FIG. 2, the light-emitting device may be provided on a rear surface of a liquid crystal panel, or as illustrated in FIG. 4, may be disposed on a side surface of a backlight unit disposed on a rear surface of a liquid crystal panel.

In the display device, the surface area of the color reproduction range on a CIE chromaticity diagram may be greater than or equal to 85% and preferably greater than or equal to 90% of the surface area of the color reproduction range defined by the BT2020 standard. The BT2020 standard is an ITU-R recommendation of the International Telecommunication Union (ITU) defining various aspects of ultra-high definition televisions (UHDTV) provided with a standard dynamic range (SDR) and a wide color gamut (WCG).

EXAMPLES

The present invention will be described in detail below using examples, but the present invention is not limited to these examples.

The average particle size of the fluoride phosphor was measured by the FSSS method using the Fisher Sub-Sieve Sizer Model 95 available from Fisher Scientific. In addition, the maximum particle size was determined by obtaining an SEM image in which approximately 500 or more particles of fluoride phosphors were observed at a magnification of 250 times and an acceleration voltage of 5 kV, selecting, from the SEM image, a plurality of particles estimated to have a maximum particle size, obtaining SEM images of the selected particles magnified 5000 times, using the 5000× SEM images, measuring the particle length of each particle, and then using the maximum value of the measured particle lengths as the maximum particle size.

The median diameter of the quantum dots was obtained by measuring the particle size of all measurable particles observed in TEM images magnified 1000000 times, determining the particle size distribution on a volume basis, and then using the particle size corresponding to a cumulative volume of 50% from the small diameter side in the particle size distribution as the median diameter.

The blended amount of the fluoride phosphors and the quantum dots was adjusted such that the x-value of the CIE chromaticity coordinates of the obtained light-emitting device was in a range from 0.26 to 0.29, and the y-value thereof was in a range from 0.24 to 0.31.

The chromaticity of the light-emitting device was measured using a spectrophotometer in a state in which the light-emitting elements were lighted. The chromaticity of the wavelength conversion member was calculated by subtracting the spectrum of the light-emitting elements from the light emission spectrum of the light-emitting device.

Example 1

A fluoride phosphor having a composition represented by $K_2[Si_{0.99}Mn_{0.01}F_6]$ and having an average particle size of 5 μm and a maximum particle size of 14 μm, and perovskite-type quantum dots (hereinafter, also referred to as QD) having a composition represented by $FAPbBr_3$ and a median particle size of 9 nm were prepared. The emission peak wavelength of the quantum dots was 521 nm, and the full width at half maximum of the emission peak was 22 nm. Here, FA in the composition means formamidinium, and the surface of each quantum dot was modified with a surfactant. As the base material, a barrier film having a thickness of 120 μm and a water vapor permeability of 0.1 g/m²·day at a temperature of 40° C. and a relative humidity of 90% was prepared.

A composition was prepared by mixing 9.2 g of KSF, 0.029 g of the QDs, 10 g of an acrylic resin raw material solution, and a photopolymerization initiator. The composition was applied onto the barrier film to form a coating layer, and one more barrier film of the same type was placed on top of the coating layer. Subsequently, the acrylic resin was polymerized and cured by irradiating with ultraviolet light, and thereby a sheet-shaped wavelength conversion member was obtained with the two barrier films sandwiching a sheet-shaped wavelength conversion layer having a thickness of 85 μm and obtained by sealing the KSF and QDs with the resin. The total thickness of the wavelength conversion member was 325 μm.

Light-emitting elements (emission peak wavelength of 450 nm) were disposed under the obtained wavelength conversion member, and a prism sheet and a polarizing sheet were disposed on the wavelength conversion member to obtain a light-emitting device.

When the light-emitting elements of the light-emitting device were turned on, the CIE chromaticity coordinates thereof included an x-value of 0.276 and a y-value of 0.274. In addition, the CIE chromaticity coordinates of the wavelength conversion member included an x-value of 0.417 and a y-value of 0.557.

Example 2

A wavelength conversion member was obtained in the same manner as in Example 1 with the exception that KSF having an average particle size of 1 μm, and a maximum particle size of 7 μm was used, the blended amount of the KSF was changed to 7.5 g, and the blended amount of the QDs was changed to 0.027 g. A light-emitting device was obtained in the same manner as in Example 1 using the obtained wavelength conversion member.

The CIE chromaticity coordinates of the obtained light-emitting device included an x-value of 0.281 and a y-value of 0.286. In addition, the CIE chromaticity coordinates of the wavelength conversion member included an x-value of 0.412 and a y-value of 0.552.

Example 3

A wavelength conversion member was obtained in the same manner as in Example 1 with the exception that KSF having a composition represented by $K_2[Si_{0.98}Mn_{0.02}F_6]$, an average particle size of 1 μm, and a maximum particle size of 5 μm was used, the blended amount of the KSF was changed to 3.5 g, and the blended amount of the QDs was changed to 0.020 g. A light-emitting device was obtained in the same manner as in Example 1 using the obtained wavelength conversion member.

The CIE chromaticity coordinates of the obtained light-emitting device included an x-value of 0.277 and a y-value of 0.252. In addition, the CIE chromaticity coordinates of the wavelength conversion member included an x-value of 0.429 and a y-value of 0.539.

Comparative Example 1

A wavelength conversion member was obtained in the same manner as in Example 1 with the exception that KSF having an average particle size of 10 μm and a maximum particle size of 25 μm was used, the blended amount of the KSF was changed to 10 g, and the blended amount of the QDs was changed to 0.031 g. A light-emitting device was obtained in the same manner as in Example 1 using the obtained wavelength conversion member.

The CIE chromaticity coordinates of the obtained light-emitting device included an x-value of 0.276 and a y-value of 0.257. In addition, the CIE chromaticity coordinates of the wavelength conversion member included an x-value of 0.430 and a y-value of 0.546.

Comparative Example 2

A wavelength conversion member was obtained in the same manner as in Comparative Example 1 with the exception that in the preparation of the composition, 0.1 g of spherical zirconia particles having a median diameter of 50 μm and a coefficient of variation of particle size of 1% were added. A light-emitting device was obtained in the same manner as in Example 1 using the obtained wavelength conversion member.

The CIE chromaticity coordinates of the obtained light-emitting device included an x-value of 0.276 and a y-value of 0.257. In addition, the CIE chromaticity coordinates of the wavelength conversion member included an x-value of 0.430 and a y-value of 0.546.

Evaluation

For each of the light-emitting devices obtained as described above, the x-value of the CIE chromaticity coordinates was measured at any 20 points on the light-emitting surface, the standard deviation ($\sigma_x$) thereof was calculated, and the color unevenness in the light-emitting surface of the light-emitting device was evaluated. The results are shown in Table 1.

TABLE 1

| | Fluoride phosphor (KSF) | | | Light-emitting device Chromaticity coordinate | | wavelength conversion member Chromaticity coordinate | | QD/KSF Blended | |
|---|---|---|---|---|---|---|---|---|---|
| | Average partilce size (μm) | Maximum particle size (μm) | Mn content (mol %) | x | y | x | y | ratio | $\sigma_x$ |
| Example 1 | 5 | 14 | 1 | 0.276 | 0.274 | 0.417 | 0.557 | 0.32% | 0.0014 |
| Example 2 | 1 | 7 | 1 | 0.281 | 0.286 | 0.412 | 0.552 | 0.36% | 0.0010 |

TABLE 1-continued

| | Fluoride phosphor (KSF) | | | Light-emitting device Chromaticity coordinate | | wavelength conversion member Chromaticity coordinate | | QD/KSF Blended | |
|---|---|---|---|---|---|---|---|---|---|
| | Average particle size | Maximum particle size | Mn content | | | | | ratio | |
| | (μm) | (μm) | (mol %) | x | y | x | y | | $\sigma_x$ |
| Example 3 | 1 | 5 | 2 | 0.277 | 0.252 | 0.429 | 0.539 | 0.57% | 0.0011 |
| Comparatibve Example 1 | 10 | 25 | 1 | 0.276 | 0.257 | 0.430 | 0.546 | 0.31% | 0.0022 |
| Comparatibve Example 2 | 10 | 25 | 1 | 0.276 | 0.257 | 0.430 | 0.546 | 0.31% | 0.0018 |

The results indicate that by using a fluoride phosphor having an average particle size of less than 10 μm, color unevenness of the light-emitting device can be suppressed. Furthermore, the results also indicate that the blended amount of the fluoride phosphor required to obtain the equivalent light emission characteristics can be reduced. The results further indicate that color unevenness can be further suppressed by adding spherical particles to the wavelength conversion layer.

Example 4

A wavelength conversion member was obtained in the same manner as in Example 1 with the exception that KSF having a composition represented by $K_2[Si_{0.98}Mn_{0.02}F_6]$, an average particle size of 1 m, and a maximum particle size of 5 μm was used, the blended amount of the KSF was changed to 3.0 g, and the blended amount of quantum dots including a chalcopyrite-type crystalline structure was changed to 0.050 g. A light-emitting device was obtained in the same manner as in Example 1 using the obtained wavelength conversion member. As the quantum dots, core-shell type quantum dots including a shell having a composition of $AgGa_{0.6}In_{0.4}S_2$ and a shell having a composition of $Ga_2S_3$ were used. The median diameter of the quantum dots including a chalcopyrite-type crystalline structure was approximately 6 nm, and the full width at half maximum of the emission peak was 29 nm.

The CIE chromaticity coordinates of the obtained light-emitting device included an x-value of 0.236 and a y-value of 0.285. In addition, the CIE chromaticity coordinates of the wavelength conversion member included an x-value of 0.347 and a y-value of 0.625.

INDUSTRIAL APPLICABILITY

The light-emitting device according to the present disclosure can be used in a wide range of fields such as in illumination, on-board lighting, displays, and liquid crystal backlights.

What is claimed is:
1. A wavelength conversion member comprising a wavelength conversion layer, the wavelength conversion layer comprising a fluoride phosphor, quantum dots, a surfactant, and a resin, wherein
the fluoride phosphor comprises fluoride particles having a composition comprising: an element M including at least one selected from the group consisting of perodic table Group 4 elements, periodic table Group 13 elements, and periodic table Group 14 elements; an alkali metal; manganese (Mn); and fluorine (F); wherein in the composition, when a number of moles of the alkali metal is 2, a number of moles of Mn is in a range from greater than 0 to less than 0.2, a number of moles of the element M is in a range from greater than 0.8 to less than 1, and a number of moles of F is in a range from greater than 5 to less than 7, and wherein the fluoride particles have an average particle size in a range from 0.1 μm to less than 10 μm and a maximum particle size in a range from 1 μm to 18 μm, and a ratio of the maximum particle size to the average particle size being greater than 1,
the quantum dots comprise at least one selected from the group consisting of a first crystalline nanoparticle and a second crystalline nanoparticle,
the first crystalline nanoparticle has a composition comprising: a cation J comprising at least one selected from the group consisting of alkali metal ions, ammonium, methylammonium, formamidinium, guanidium, imidazolium, pyridinium, pyrrolidium, and protonated thiourea; a metal L comprising at least one selected from the group consisting of germanium, tin, lead, antimony, and bismuth; and an anion X including at least one selected from the group consisting of halogen ions, cyanide ions, thiocyanate ions, isothiocyanate ions, and sulfide ions, wherein in the composition, when a number of moles of the cation J is 1, a number of moles of the metal L is in a range from 0.9 to 1.1, and a number of moles of the anion X is in a range from 2.7 to 3.3, wherein the first crystalline nanoparticle have a median diameter in a range from 3 nm to 15 nm and emit light having an emission peak at a wavelength in a range from 510 nm to 535 nm when irradiated with light having a wavelength of 450 nm, and wherein a full width at half maximum of the emission peak of the first crystalline nanoparticle is in a range from 10 nm to 30 nm, and
the second crystalline nanoparticle comprises a chalcopyrite-type crystalline structure, and a full width at half maximum of the emission peak of the second crystalline nanoparticle is 45 nm or less.
2. The wavelength conversion member according to claim 1, wherein the fluoride phosphor is obtained by adhering an inorganic substance other than the fluoride particles to at least a portion of a surface of the fluoride particles.
3. The wavelength conversion member according to claim 1, wherein the wavelength conversion layer has a mass ratio of a content of the quantum dots to a content of the fluoride phosphor in a range from 0.2% to 10%.
4. The wavelength conversion member according to claim 1, wherein the wavelength conversion layer has a sheet shape with an average thickness in a range from 10 μm to 100 μm.

5. The wavelength conversion member according to claim 1, obtained by sandwiching the wavelength conversion layer between two base materials having a water vapor permeability of 1 g/m²·day or less at a temperature of 40° C. and a relative humidity of 90%.

6. The wavelength conversion member according to claim 5, further comprising a seal member that surrounds an outer peripheral section of the two base materials and seals the wavelength conversion layer, the seal member having a water vapor permeability of 1 g/m²·day or less a temperature of 40° C. and a relative humidity of 90%.

7. The wavelength conversion member according to claim 1, wherein the wavelength conversion layer further comprises spherical particles, wherein the spherical particles have a median diameter in a range from 10 μm to 100 μm, and wherein a coefficient of variation (CV value) of a particle size distribution of the spherical particles is 6% or less.

8. The wavelength conversion member according to claim 1, wherein the wavelength conversion layer is formed in a pore portion of a porous film having a honeycomb structure.

9. The wavelength conversion member according to claim 1, wherein when the wavelength conversion layer is irradiated with light having an emission peak wavelength in a wavelength range from 420 nm to 480 nm, the wavelength conversion layer emits light having CIE chromaticity coordinates including an x-value in a range from 0.355 to 0.595 and a y-value in a range from 0.404 to 0.639.

10. The wavelength conversion member according to claim 1, wherein the fluoride particles comprise silicone (Si) and/or Ge (germanium) as the element M in the composition thereof, and when the number of moles of the alkali metal is 2, a total number of moles of Si, Ge, and Mn is in a range from 0.9 to 1.1.

11. The wavelength conversion member according to claim 1, wherein the fluoride particles have the composition represented by Formula (1) below:

$$A^1_c[M^1_{1-b}Mn_bF_d] \quad (1)$$

wherein $A^1$ is at least one selected from the group consisting of lithium (Li), sodium (Na), potassium (K), rubidium (Rb) and cesium (Cs); $M^1$ comprises at least Si and/or Ge, and optionally further comprises at least one element selected from the group consisting of Group 4 elements and Group 14 elements; b satisfies 0<b<0.2, c is an absolute value of the charge of $[M^1_{1-b}Mn_bF_d]$, and d satisfies 5<d<7.

12. The wavelength conversion member according to claim 1, wherein the fluoride particles comprise Si and aluminum (Al) as the element M in the composition thereof, and when the number of moles of the alkali metal is 2, a total number of moles of Si, Al and Mn is in a range from 0.9 to 1.1, and the number of moles of Al is in a range from greater than 0 to 0.1.

13. The wavelength conversion member according to claim 1, wherein the fluoride particles have the composition represented by Formula (2) below:

$$A^2_f[M^2_{1-e}Mn_eF_g] \quad (2)$$

wherein $A^2$ is at least one selected from the group consisting of Li, Na, K, Rb, and Cs; $M^2$ comprises at least Si and Al, and optionally further comprises at least one element selected from the group consisting of Group 4 elements, Group 13 elements, and Group 14 elements; e satisfies 0<e<0.2, f is an absolute value of the charge of $[M^2_{1-e}Mn_eF_g]$, and g satisfies 5<g<7.

14. The wavelength conversion member according to claim 1, wherein the quantum dots comprise a crystalline nanoparticle having a composition represented by Formula (3) below:

$$J_pL_qX_r \quad (3)$$

wherein J comprises at least one selected from the group consisting of alkali metal ions, ammonium, methylammonium, formamidinium, guanidium, imidazolium, pyridinium, pyrrolidium, and protonated thioureas; L comprises at least one selected from the group consisting of germanium, tin, lead, antimony, and bismuth; X comprises at least one selected from the group consisting of halogen ions, cyanide ions, thiocyanate ions, isothiocyanate ions, and sulfide ions; p represents a number in a range from 0.9 to 1.1, q represents a number in a range from 0.9 to 1.1, and r represents a number in a range from 2.7 to 3.3.

15. A light-emitting device comprising: the wavelength conversion member described in claim 1; and a light-emitting element.

16. A display device comprising the light-emitting device described in claim 15, wherein a surface area of a color reproduction range on a CIE chromaticity diagram is greater than or equal to 85% of a surface area of a color reproduction range defined by the BT2020 standard.

17. The wavelength conversion member according to claim 1, further comprising an inorganic substance other than the fluoride particles adhered to at least a portion of a surface of the fluoride particles.

18. The wavelength conversion member according to claim 1, further comprising a base material having a water vapor permeability of 1 g/m²·day or less at a temperature of 40° C. and a relative humidity of 90%, wherein the base material is disposed on a main surface of the wavelength conversion layer.

19. The wavelength conversion member according to claim 18, comprising two base materials disposed on both of two main surfaces of the wavelength conversion layer such that the two base materials sandwich the wavelength conversion layer.

* * * * *